(12) United States Patent
Cho et al.

(10) Patent No.: US 12,537,418 B2
(45) Date of Patent: Jan. 27, 2026

(54) ELECTRONIC DEVICE COMPRISING DRIVE MOTOR

(71) Applicant: Samsung Electronics Co., Ltd., Suwon-si (KR)

(72) Inventors: Hyoungtak Cho, Suwon-si (KR); Junyoung Choi, Suwon-si (KR); Myunghoon Kwak, Suwon-si (KR); Moonsun Kim, Suwon-si (KR); Baekeun Cho, Suwon-si (KR); Soyoung Lee, Suwon-si (KR); Yangwook Kim, Suwon-si (KR); Junghyeob Lee, Suwon-si (KR); Jookwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 209 days.

(21) Appl. No.: 18/488,288

(22) Filed: Oct. 17, 2023

(65) Prior Publication Data
US 2024/0048025 A1 Feb. 8, 2024

Related U.S. Application Data

(63) Continuation of application No. PCT/KR2022/014547, filed on Sep. 28, 2022.

(30) Foreign Application Priority Data

Sep. 29, 2021 (KR) ........................ 10-2021-0128813

(51) Int. Cl.
*H05K 5/02* (2006.01)
*H02K 7/116* (2006.01)
*H02P 29/00* (2016.01)

(52) U.S. Cl.
CPC .............. *H02K 7/116* (2013.01); *H02P 29/00* (2013.01); *H05K 5/0217* (2013.01)

(58) Field of Classification Search
CPC ..... H05K 5/0017; H05K 5/0217; H02K 7/116
(Continued)

(56) References Cited

U.S. PATENT DOCUMENTS 10,582,629 B2   3/2020 Xu et al.
10,684,714 B2   6/2020 Seo et al.
(Continued)

FOREIGN PATENT DOCUMENTS

EP          4047913 A1      8/2022
KR       10-0501188 B1      7/2005
(Continued)

OTHER PUBLICATIONS

International Search Report dated Jan. 6, 2023, issued in International Patent Application No. PCT/KR2022/014547.
(Continued)

*Primary Examiner* — Hung S. Bui
(74) *Attorney, Agent, or Firm* — Jefferson IP Law, LLP

(57) ABSTRACT

An electronic device is provided. The electronic device includes a first housing, a second housing slidably coupled to the first housing, a flexible display configured to be expanded or contracted based on slide-out or slide-in movement of the second housing, a drive motor disposed in the second housing and including a pinion gear, a rack gear structure disposed in the first housing and including a rack gear engaged with the pinion gear, at least one sensor module configured to detect movement of the second housing, a memory configured to store executable instructions, and at least one processor configured to access the memory (Continued)

and execute the instructions, and control the drive motor based on sensing information detected from the at least one sensor module.

18 Claims, 31 Drawing Sheets

(58) Field of Classification Search
USPC .......................................................... 361/807
See application file for complete search history.

(56) References Cited

U.S. PATENT DOCUMENTS

| | | | |
|---|---|---|---|
| 10,747,269 | B1 | 8/2020 | Choi et al. |
| 10,976,775 | B1 | 4/2021 | Cha |
| 11,016,532 | B2 | 5/2021 | Yang |
| 11,058,018 | B1 | 7/2021 | Yoon et al. |
| 2013/0058063 | A1 | 3/2013 | O'Brien |
| 2014/0002430 | A1 | 1/2014 | Kwack et al. |
| 2021/0135492 | A1 | 5/2021 | Kim et al. |
| 2021/0195009 | A1* | 6/2021 | Choi .................... G06F 1/1652 |
| 2021/0278878 | A1 | 9/2021 | Shim et al. |
| 2023/0336646 | A1 | 10/2023 | Shim et al. |

FOREIGN PATENT DOCUMENTS

| | | |
|---|---|---|
| KR | 10-2014-0001490 A | 1/2014 |
| KR | 10-2016-0000788 A | 1/2016 |
| KR | 10-2017-0012956 A | 2/2017 |
| KR | 10-2019-0077107 A | 7/2019 |
| KR | 10-2019-0115888 A | 10/2019 |
| KR | 10-2021-0090926 A | 7/2021 |
| KR | 10-2274481 B1 | 7/2021 |
| WO | 2021-042572 A1 | 3/2021 |
| WO | 2021-075610 A1 | 4/2021 |
| WO | 2021-160276 A1 | 8/2021 |

OTHER PUBLICATIONS

Extended European Search Report dated Oct. 10, 2024, issued in European Application No. 22876839.6-1218.

* cited by examiner

ELECTRONIC DEVICE COMPRISING DRIVE MOTOR

CROSS-REFERENCE TO RELATED APPLICATION(S)

This application is a continuation application, claiming priority under § 365(c), of an International application No. PCT/KR2022/014547, filed on Sep. 28, 2022, which is based on and claims the benefit of a Korean patent application number 10-2021-0128813, filed on Sep. 29, 2021, in the Korean Intellectual Property Office, the disclosure of which is incorporated by reference herein in its entirety.

BACKGROUND

1. Field

The disclosure relates to an electronic device including a drive motor.

2. Description of Related Art

Electronic devices are gradually becoming slimmer and more rigid, being strengthened in design aspects, and being improved to differentiate functional elements thereof. Electronic devices are being gradually transformed from a uniform rectangular shape into various shapes. An electronic device may have a transformable structure that is convenient to carry and enables the use of a large-screen display. For example, an electronic device may have a structure capable of varying the display area of a flexible display (e.g., a rollable structure or a slidable structure) by supporting housings that operate in a sliding manner relative to each other. Such an electronic device may include a drive motor capable of automatically sliding the housings.

The above information is presented as background information only to assist with an understanding of the disclosure. No determination has been made, and no assertion is made, as to whether any of the above might be applicable as prior art with regard to the disclosure.

SUMMARY

An electronic device may include a rollable electronic device in which the display area of a flexible display is expandable and/or contractible (e.g., a slidable electronic device). The rollable electronic device may include a first housing (e.g., a first housing structure, a base housing, a base bracket, or a base structure) and a second housing (e.g., a second housing structure, a slide housing, a slide bracket, or a slide structure), which are movably coupled to each other in a manner of being at least partially fitted together. For example, the first housing and the second housing are slidably operated with respect to each other and support at least a portion of a flexible display (or an expandable display or a stretchable display), whereby, in a slide-in state, the flexible display may be induced to have a first display area, and in a slide-out state, the flexible display may be induced to have a second display area that is greater than the first display area.

The electronic device may include a manual slide module (e.g., a spring hinge module) that is disposed between the first housing and the second housing and is semi-automatically changed to the slide-in state or the slide-out state when pressed in a direction of being closed or opened beyond a predetermined inflection point. However, the manual sliding structure may interfere with a smooth sliding operation by the repulsive force of the flexible display and may be difficult to design to perform the sliding operation by uniformly distributing the repulsive force of the flexible display and the elastic force of the manual slide module (e.g., a spring hinge).

In order to address this issue, the electronic device may include a drive module that is disposed in the inner space and automatically operates the second housing to be slidable from the first housing. The drive module may include a drive motor including a pinion gear (e.g., a first gear) disposed in the first housing, and a gear structure disposed in the second housing and including a rack gear (e.g., a second gear) engaged with a pinion gear. Here, the term "engaged" may be used to mean that the pinion gear and the rack gear are meshed with each other. For example, when the pinion gear is rotated by the drive motor, the rack gear engaged with the pinion gear is moved, so that the rack gear structure and the second housing may be moved by a predetermined reciprocating distance. The electronic device may drive the drive module by detecting a user's triggering motion for slide-in/slide-out, for example, operating a physical key button or touch pad exposed on a housing or selecting an object displayed on the flexible display.

However, such a uniform triggering method not only provides a tedious experience to the user, but also causes inconvenience in recognizing a physical or software button mechanism for the sliding operation.

Aspects of the disclosure are to address at least the above-mentioned problems and/or disadvantages and to provide at least the advantages described below. Accordingly, an aspect of the disclosure is to provide an electronic device including a drive motor capable of providing a user with an intuitive triggering method for a slide-in/slide-out operation.

Another aspect of the disclosure is to provide an electronic device including a drive motor improved in terms of convenience in use.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing slidably coupled to the first housing, a flexible display configured to be expanded or contracted based on slide-out or slide-in movement of the second housing, a drive motor disposed in the second housing and including a pinion gear, a rack gear structure disposed in the first housing and including a rack gear engaged with the pinion gear, at least one sensor module configured to detect movement of the second housing, a memory configured to store executable instructions, and at least one processor configured to access the memory and execute the instructions, and control the drive motor based on sensing information detected from the at least one sensor module.

In accordance with another aspect of the disclosure, an electronic device is provided. The electronic device includes a first housing, a second housing including a sliding frame slidably coupled to the first housing, a flexible display disposed to be supported by the first housing and the second housing and having an exposed area that is expanded when at least a portion of the second housing changes from a slide-in state of being accommodated in the first housing to a slide-out state, a drive motor disposed in the sliding frame and including a pinion gear, a rack gear structure including a rack gear disposed in the first housing to be at least partially movable in a sliding direction and engaged with the pinion gear, at least one sensor module disposed in the first housing and configured to detect movement of the sliding frame, and at least one processor configured to control the drive motor based on sensing information provided from the at least one sensor module, and drive the drive motor when detecting that the second housing is moved by a predetermined movement distance in a slide-in direction via the at least one sensor module.

An electronic device according to various embodiments of the disclosure is capable of providing an intuitive experience and convenience of use to a user by providing a triggering operation for slide-in/slide-out via a push-pull sliding structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
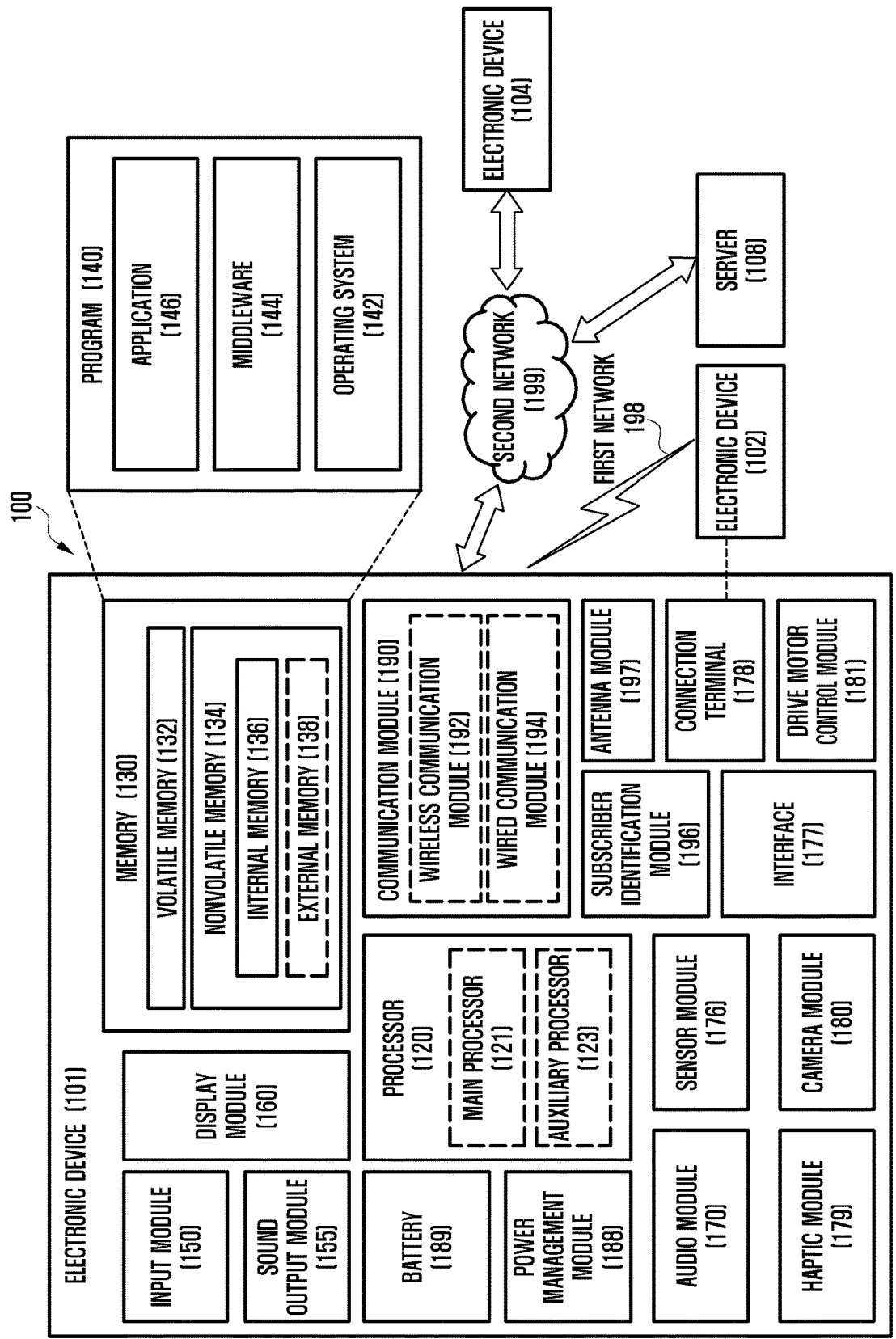
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the 11 connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160). 11

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. The non-volatile memory 134 may include an internal memory 136 and an external memory 138. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

Figure 4:
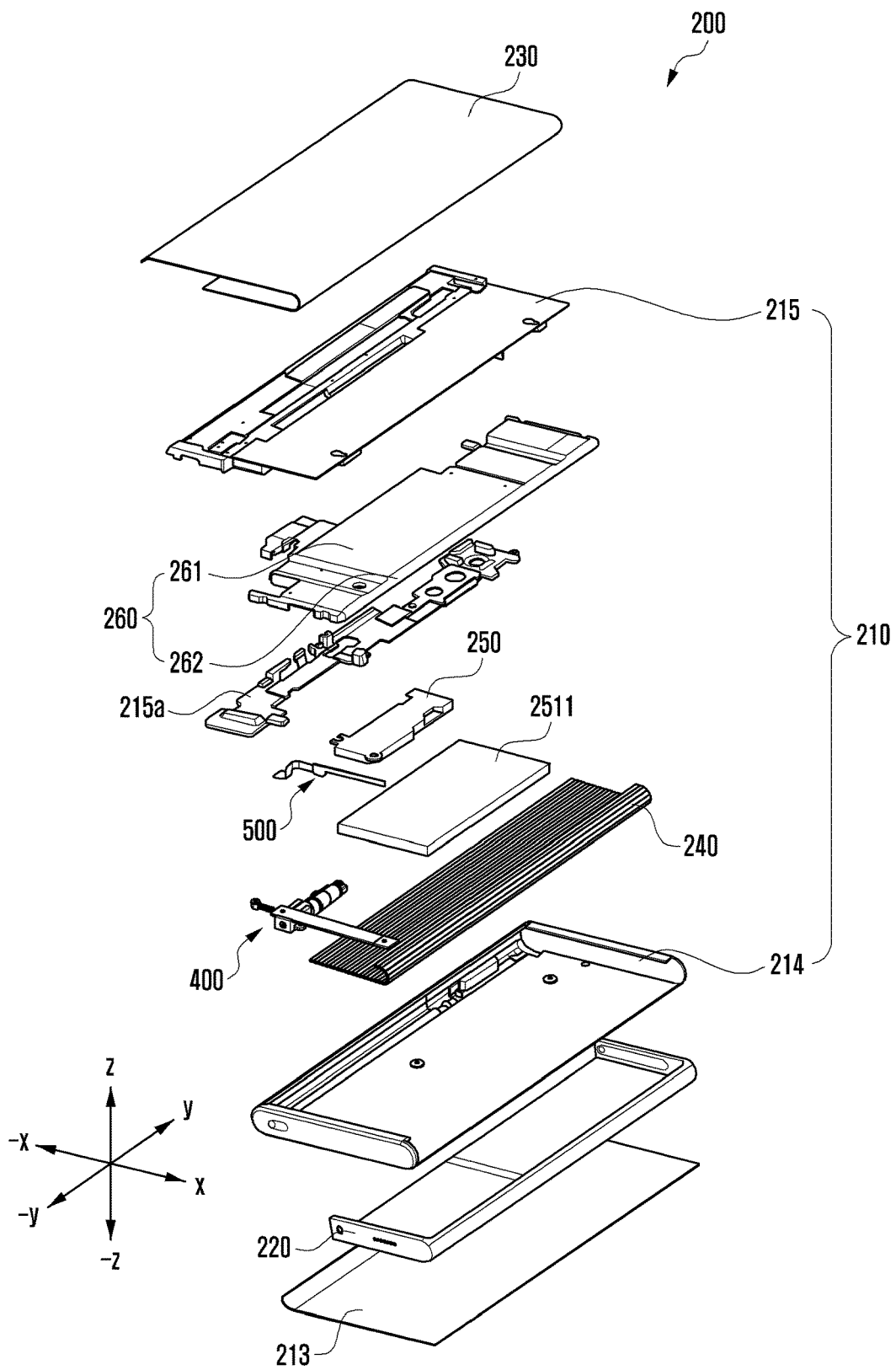
FIG. 4 is an exploded perspective view of an electronic device according to an embodiment of the disclosure.

According to various embodiments of the disclosure, the sensor module 176 may include a movement distance detection sensor (e.g., a movement distance detection sensor 500 in FIG. 4) configured to detect the movement distance of the second housing (e.g., the second housing 220 in FIG. 4) from the first housing (e.g., the first housing 210 in FIG. 4) of an electronic device (e.g., the electronic device 200 in FIG. 4). According to an embodiment of the disclosure, the sensor module 176 may detect the slide-in state or slide-out state of the second housing 220 from the first housing 210 or the moving state of the first housing 210 corresponding to a push-pull section as a triggering operation for sliding. In some embodiments of the disclosure, the processor 120 may be configured to detect the movement distance in real time via the sensor module 176 while the second housing 220 is moving from the first housing 210 and to control the display module 160 to display an object corresponding to a changing display area via a display (e.g., a flexible display 230 in FIG. 4). According to an embodiment of the disclosure, the electronic device 101 may include a drive motor control module 181 configured to control the operation of a drive module (e.g., the drive module in FIG. 4) disposed inside the electronic device. For example, when the movement distance detected through the movement of the second housing 220 corresponds to the push-pull section (e.g., a predetermined movement distance or triggering section) while a drive module 400 is not operating, the processor 120 may operate the drive module 400 to switch the second housing 220 into the slide-in state or the slide-out state via the drive motor control module 181. In some embodiments of the disclosure, the drive motor control module 181 may be replaced by the processor 120.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
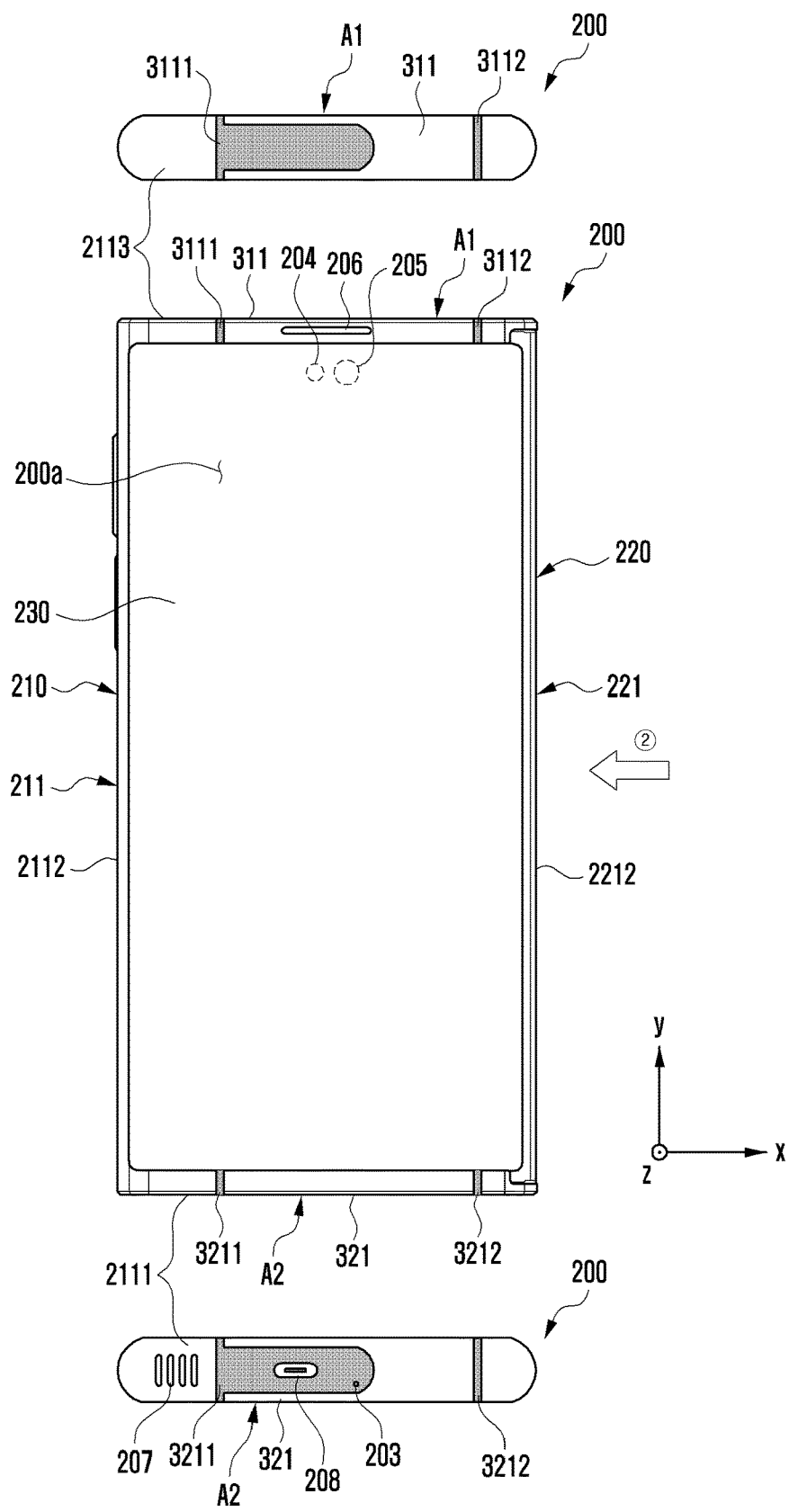
FIGS. 2A and 2B are views illustrating front and rear surfaces of an electronic device in a slide-in state according to various embodiments of the disclosure.
Figure 2B:
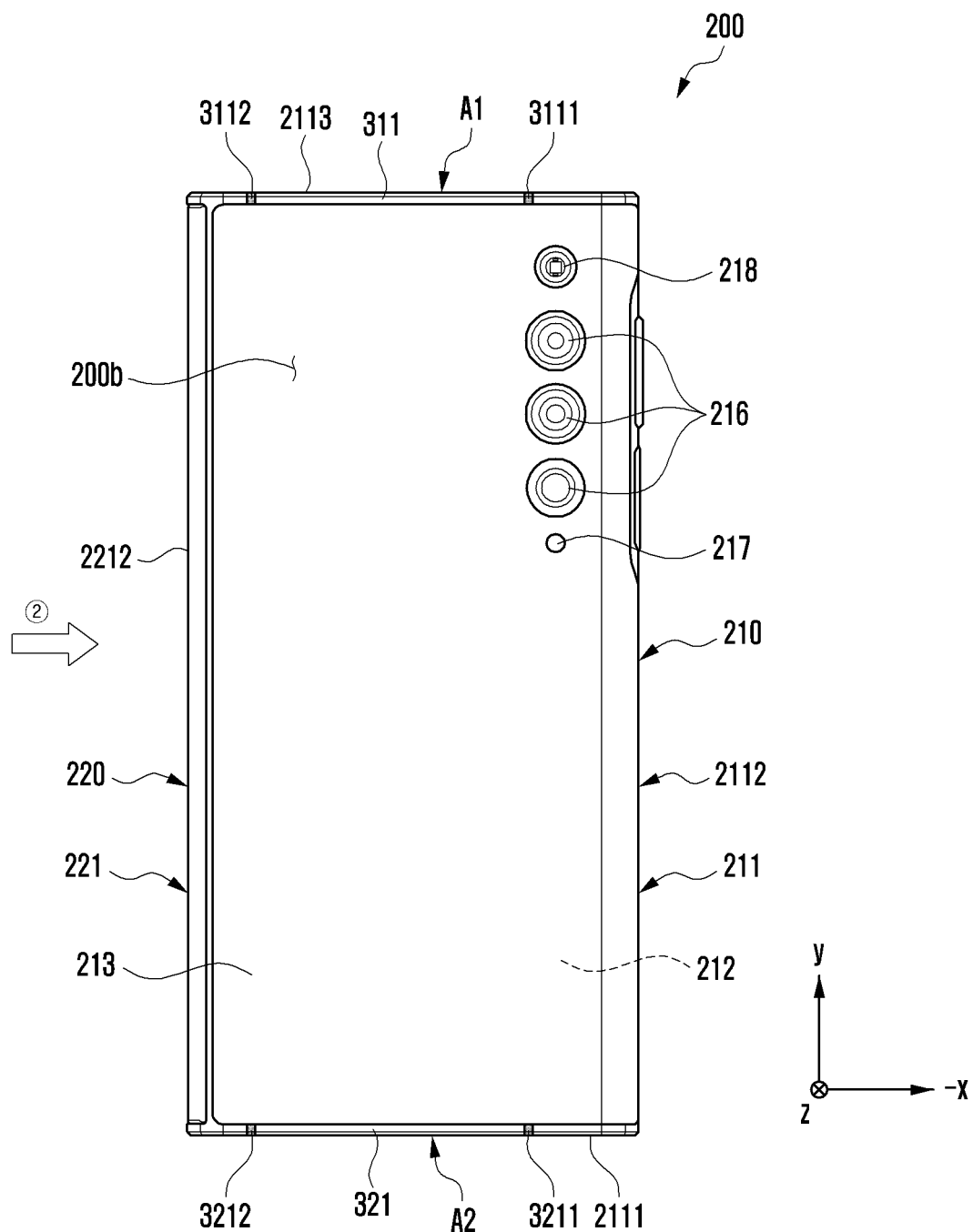
Figure 3A:
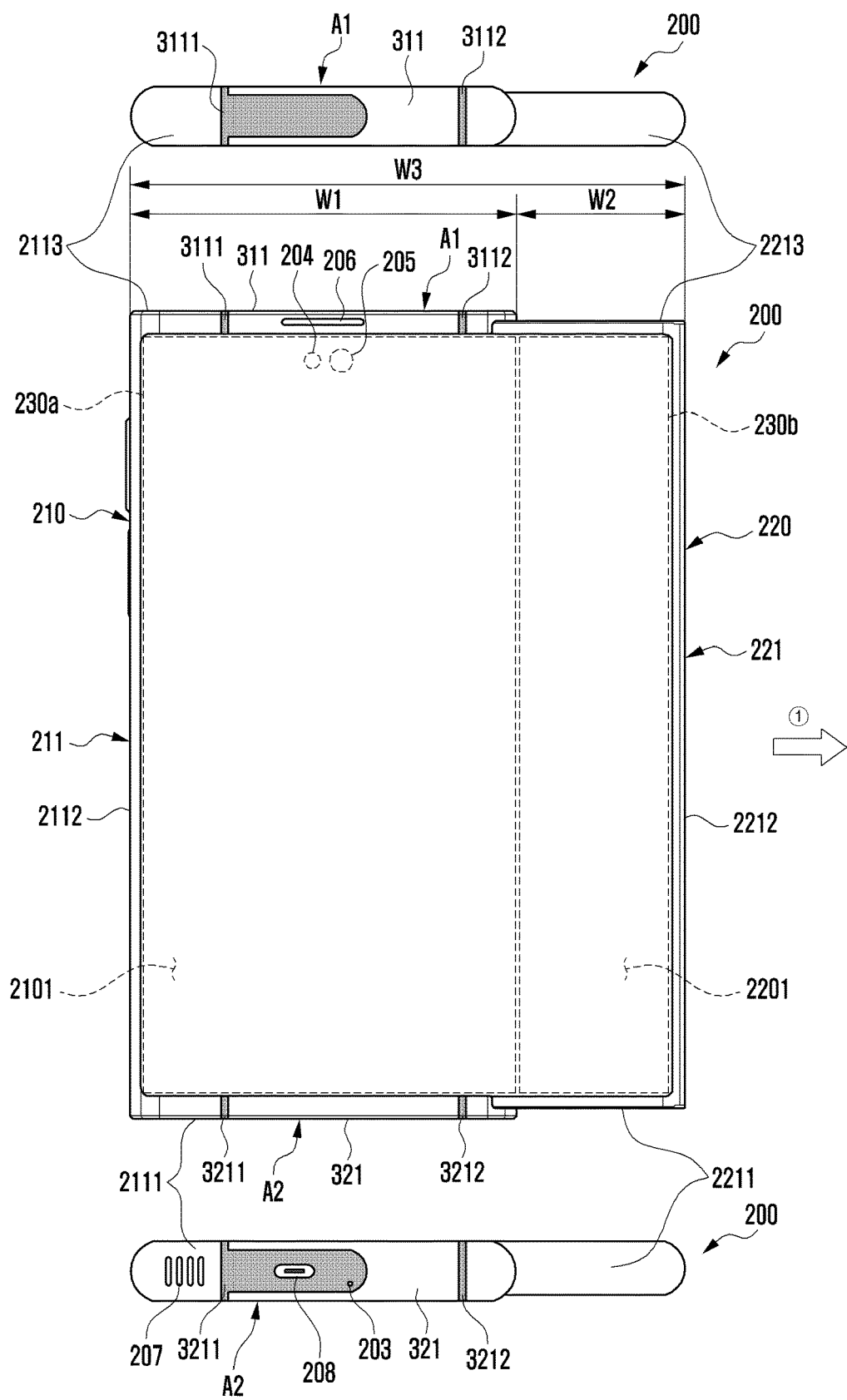
FIGS. 3A and 3B are views illustrating front and rear surfaces of the electronic device in a slide-out state according to various embodiments of the disclosure.
Figure 3B:
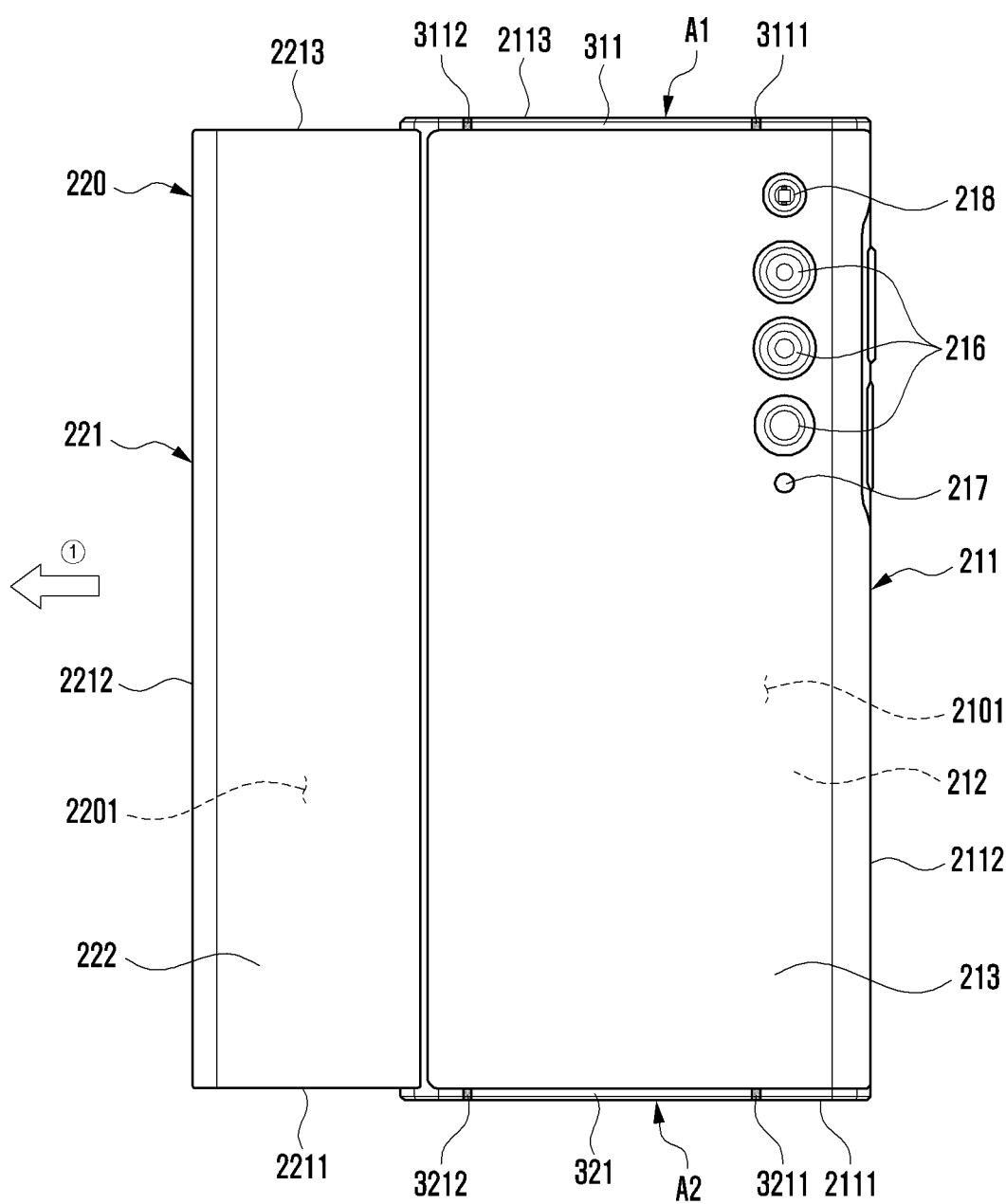

FIGS. 2A and 2B are views illustrating front and rear surfaces of an electronic device in a slide-in state according to various embodiments of the disclosure. FIGS. 3A and 3B are views illustrating front and rear surfaces of the electronic device in a slide-out state according to various embodiments of the disclosure.

The electronic device 200 of FIGS. 2A, 2B, 3A, and 3B may be at least partially similar to the electronic device 101 of FIG. 1 or may further include other embodiments of the electronic device.

Referring to FIGS. 2A, 2B, 3A, and 3B, the electronic device 200 may include a first housing 210 (e.g., a first housing structure or a base housing), a second housing 220 (e.g., a second housing structure or a slide housing) coupled to the first housing 210 to be movable within a predetermined distance from the first housing 210 in a predetermined direction (e.g., the x-axis direction), and a flexible display (e.g., an expandable display or a stretchable display) 230 disposed to be supported by at least a portion of the first housing 210 and the second housing 220. According to an embodiment of the disclosure, at least a portion of the second housing 220 may be changed into a slide-in state by being accommodated in a first space 2101 of the first housing 210. According to an embodiment of the disclosure, in the slide-out state, the electronic device 200 may include a support member (e.g., a bendable member or a bendable support member) (e.g., the support member 240 in FIG. 4) (e.g., an articulated hinge module or a multi-bar assembly) which at least partially defines the same plane as at least a portion of the first housing 210 in the slide-out state and at least partially accommodated into a second space 2201 of the second housing 220. According to an embodiment of the disclosure, in the slide-in state, at least a portion of the flexible display 230 may be disposed to be invisible from the outside by being accommodated in the inner space 2201 of the second housing 220 while being supported by the support member (e.g., the support member 240 in FIG. 4). According to an embodiment of the disclosure, in the slide-out state, at least a portion of the flexible display 230 may be disposed to be visible from the outside while being supported by the support member (e.g., the support member 240 in FIG. 4) which at least partially defines the same plane as the first housing 210.

According to various embodiments of the disclosure, the electronic device 200 may include a front surface 200*a* (e.g., a first surface), a rear surface 200*b* (e.g., a second surface) facing a direction opposite to the front surface 200*a*, and a side surface (not illustrated) surrounding the space between the front surface 200*a* and the rear surface 200*b*. According to an embodiment of the disclosure, the electronic device 200 may include a first housing 210 including a first side surface member 211 and a second housing 220 including a second side surface member 221. According to an embodiment of the disclosure, the first side surface member 211 may include a first side surface 2111 having a first length along a first direction (e.g., the x-axis direction), a second side surface 2112 extending from the first side surface 2111 along a direction (e.g., the y-axis direction) substantially perpendicular to the first side surface 2111 and having a second length longer than the first length, and a third side surface 2113 extending from the second side surface 2111 to be substantially parallel to the first side surface 2111 and having the first length. According to an embodiment of the disclosure, at least a portion of the first side surface member 211 may be made of a conductive material (e.g., metal). According to an embodiment of the disclosure, at least a portion of the first side surface member 211 may include a first extension member 212 extending to at least a portion of the first space 2101 of the first housing 210.

According to various embodiments of the disclosure, the second side surface member 221 may include a fourth side surface 2211 at least partially corresponding to the first surface 2111 and having a third length, a fifth side surface 2212 extending from the fourth side surface 2211 in a direction substantially parallel to the second side surface 2112 and having a fourth length that is longer than the third length, and a sixth side surface 2213 extending from the fifth side surface 2212 to correspond to the third side surface 2113 and having the third length. According to an embodiment of the disclosure, at least a portion of the second side surface member 221 may be made of a conductive material (e.g., metal). According to an embodiment of the disclosure, at least a portion of the second side surface member 221 may include a second extension member 222 extending to at least a portion of the second space 2201 of the second housing 220. According to an embodiment of the disclosure, the first side surface 2111 and the fourth side surface 2211 may be slidably coupled to each other, and the third side surface 2113 and the sixth side surface 2213 may be slidably coupled to each other. According to an embodiment of the disclosure, in the slide-in state, the fourth side surface 2211 may be disposed to be substantially invisible from the outside by overlapping the first side surface 2211. According to an embodiment of the disclosure, in the slide-in state, the sixth side surface 2213 may be disposed to be substantially invisible from the outside by overlapping the third side surface 2213. In some embodiments of the disclosure, at least a portion of the fourth and sixth side surfaces 2211 and 2213 may be disposed to be at least partially visible from the outside in the slide-in state. According to an embodiment of the disclosure, in the slide-in state, the second extension member 222 may be disposed to be substantially invisible from the outside by overlapping the first extension member 212. In some embodiments of the disclosure, in the slide-in state, a portion of the second extension member 222 may be disposed to be invisible from the outside by overlapping the first extension member 212 and the remaining portion of the second extension member 222 may be disposed to be visible from the outside. According to an embodiment of the disclosure, the electronic device may include a rear surface cover 213 disposed in at least a portion of the first housing 210 on the rear surface 200b. According to an embodiment of the disclosure, the rear surface cover 213 may be disposed through at least a portion of the first extension member 212. In some embodiments of the disclosure, the rear surface cover 213 may be integrated with the first side surface member 211. According to an embodiment of the disclosure, the rear surface cover 213 may be made of, for example, polymer, coated or colored glass, ceramic, metal (e.g., aluminum, stainless steel (STS), or magnesium), or a combination of two or more of these materials. In some embodiments of the disclosure, the rear surface cover 213 may extend to at least a portion of the first side surface member 211. In some embodiments of the disclosure, at least a portion of the first extension member 212 may be replaced with the rear surface cover 213. In some embodiments of the disclosure, the electronic device 200 may include another rear surface cover (e.g., a second rear surface cover) disposed in at least a portion of the second extension member 222 in the second housing 220 or replaced with at least a portion of the second extension member 222.

According to various embodiments of the disclosure, the electronic device 200 may include a flexible display 230 disposed to be supported by at least a portion of the first housing 210 and the second housing 220. According to an embodiment of the disclosure, the flexible display 230 may include a first portion 230a (e.g., a flat portion) that is always visible from the outside, and a second portion 230b (e.g., a bendable portion) extending from the first portion 230a and at least partially accommodated in the second space 2201 of the second housing 220 to be invisible from the outside in the slide-in state. According to an embodiment of the disclosure, the first portion 230a may be disposed to be supported by the first housing 210, and the second portion 230b may be disposed to be at least partially supported by the support member (e.g., the support member 240 in FIG. 4). According to an embodiment of the disclosure, in the state in which the second housing 220 is slid out along a predetermined direction (direction CI), the flexible display 230 may extend from the first portion 230a while being supported by the support member (e.g., the support member 240 in FIG. 4), may define the substantially plane as the first portion 230a, and may be disposed to be visible from the outside. According to an embodiment of the disclosure, in the state in which the second housing 220 is slid in along a predetermined direction (direction), the second portion 230b of the flexible display 230 may be disposed to be accommodated into the second space 2201 of the second housing 220 and to be invisible from the outside. Accordingly, in the electronic device 200, the display area of the flexible display 230 may be induced to be variable as the second housing 220 is moved in a sliding manner from the first housing 210 along a predetermined direction (e.g., the x-axis direction).

According to various embodiments of the disclosure, the first housing 210 and the second housing 220 may be operated with respect to each other in a sliding manner such that the entire width is variable. According to an embodiment of the disclosure, the electronic device 200 may be configured to have a first width W1 from the second side surface 2112 to the fifth side surface 2212 in the slide-in state. According to an embodiment of the disclosure, the electronic device 200 may be configured to have a third width W3 that is greater than the first width W1 in the slide-out state by moving at least a portion of the support member (e.g., the support member 240 in FIG. 4) accommodated in the second space 2201 of the second housing 210 to have an additional second width W2. For example, in the slide-in state, the flexible display 230 may have a display area substantially corresponding to the first width W1, and in the slide-out state, the flexible display 230 may have an expanded display area substantially corresponding to the third width W3.

According to various embodiments of the disclosure, the slide-in/slide-out operation of the electronic device 200 may be automatically performed. For example, when a triggering operation of changing the electronic device 200 from the slide-in state to the slide-out state or from the slide-out state to the slide-in state is detected in the state in which the drive module (e.g., the drive module 400 in FIG. 4) is not operated, the electronic device 200 may operate the drive module (e.g., the drive module 400 in FIG. 4) disposed therein. According to an embodiment of the disclosure, the triggering operation may include an operation of detecting a movement distance moved by a push-pull section to the direction where the second housing is to be slid in (e.g., direction ②). For example, the electronic device 200 may be operatively connected to the processor (e.g., the processor 120 of FIG. 1), the drive module (e.g., the drive module 400 of FIG. 4) may be operated or stopped by a drive motor control module (e.g., the drive motor control module 181 of FIG. 1) configured to control (e.g., servo control) the drive motor (e.g., the drive motor 410 of FIG. 5) of the drive module (e.g., the drive module 400 of FIG. 4).

According to various embodiments of the disclosure, the electronic device 200 may include at least one of an input device (e.g., a microphone 203) disposed in the first space 2101 of the first housing 210, a sound output device (e.g., a call receiver 206 or a speaker 207), sensor modules 204 and 217, a camera module (e.g., the first camera module 205 or the second camera module 216), a connector port 208, a key input device (not illustrated), or an indicator (not illustrated). As another embodiment of the disclosure, the electronic device 200 may be configured such that at least one of the above-mentioned components is omitted or other components are additionally included. As another embodiment of the disclosure, at least one of the above-described components may be disposed in the second space 2201 of the second housing 220.

According to various embodiments of the disclosure, the input device may include a microphone 203. In some embodiments of the disclosure, the input device (e.g., the microphone 203) may include multiple microphones arranged to detect the direction of sound. The sound output device may include, for example, a call receiver 206 and a speaker 207. According to an embodiment of the disclosure, the speaker 207 may face the outside through at least one speaker hole provided in the first housing 210 in the slide-out state. According to an embodiment of the disclosure, in the slide-out state, the connector port 208 may face the outside through a connector port hole disposed in the first housing 210. In some embodiments of the disclosure, the call receiver 206 may include a speaker that is operated without a separate speaker hole (e.g., a piezo speaker).

According to various embodiments of the disclosure, the sensor modules 204 and 217 may generate electrical signals or data values corresponding to the internal operating state of the electronic device 200 or an external environmental state. The sensor modules 204 and 217 may include, for example, a first sensor module 204 (e.g., a proximity sensor or an illuminance sensor) disposed on the front surface 200*a* of the electronic device 200 and/or a second sensor module 217 (e.g., a heart rate monitoring (HRM) sensor) disposed on the rear surface 200*b*. According to an embodiment of the disclosure, the first sensor module 204 may be disposed under the flexible display 230 in the front surface 220*a* of the electronic device 200. According to an embodiment of the disclosure, the first sensor module 204 and/or the second sensor module 217 may include at least one of a proximity sensor, an illuminance sensor, a time-of-flight (TOF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various embodiments of the disclosure, the camera module may include a first camera module 205 disposed on the front surface 200*a* of the electronic device 200 and a second camera module 216 disposed on the rear surface 200*b*. According to an embodiment of the disclosure, the electronic device 200 may include a flash 218 located near the second camera module 216. According to an embodiment of the disclosure, the camera modules 205 and 216 may include one or more lenses, an image sensor, and/or an image signal processor. According to an embodiment of the disclosure, the first camera module 205 may be disposed under the flexible display 230 and may be configured to photograph a subject through a portion of an active area of the flexible display 230. According to an embodiment of the disclosure, the flash 218 may include, for example, a light-emitting diode or a xenon lamp.

According to various embodiments of the disclosure, the first camera module 205 out of the camera modules and some sensor modules 204 out of the sensor modules 204 and 217 may be disposed to detect the external environment through the flexible display 230. For example, the first camera module 205 or some sensor modules 204 may be disposed in the first space 2201 of the first housing 210 to be in contact with the external environment through a transmission area or a perforated opening provided in the flexible display 230. According to an embodiment of the disclosure, the area of the flexible display 230, which faces the first camera module 205, may be configured as a transmission area having a predetermined transmittance as a portion of a content display area. According to an embodiment of the disclosure, the transmission area may have a transmittance ranging from about 5% to about 20%. The transmission area may include an area overlapping an effective area (e.g., a field of view area) of the first camera module 205 through which light imaged by an image sensor to generate an image passes. For example, the transmission area of the flexible display 230 may include an area having a lower pixel density and/or a lower wiring density than the surrounding area. For example, the transmission area may replace the above-mentioned opening. For example, some camera modules 205 may include an under-display camera (UDC). In some embodiments of the disclosure, some of the sensor modules 204 may be disposed to perform the functions thereof in the inner space of the electronic device 200 without being visually exposed through the flexible display 230.

According to various embodiments of the disclosure, the electronic device 200 may include one or more antenna elements A1 and A2 electrically connected to a wireless communication circuit (e.g., the wireless communication module 192 in FIG. 1) disposed in the first space 2101 of the second housing 210. According to an embodiment of the disclosure, the one or more antennas A1 and A2 may include a first antenna A1 disposed in an upper area of the electronic device 200 and a second antenna A2 disposed in a lower area of the electronic device 200. In some embodiments of the disclosure, the electronic device 200 may further include at least one additional antenna disposed on the second side surface 2112 of the first housing 210 and/or the fifth side surface 2212 of the second housing 220. According to an embodiment of the disclosure, the first antenna A1 may include a first conductive portion 311 split from the third side surface 2113 of the first side surface member 211 by one or more non-conductive portions 3111 and 3112. According to an embodiment of the disclosure, the first conductive portion 311 may be disposed to be split by a first non-conductive portion 3111 and a second non-conductive portion 3112 spaced apart from each other by a predetermined interval and may be electrically connected to the wireless communication module (e.g., the wireless communication module 192 in FIG. 1). According to an embodiment of the disclosure, the second antenna A2 may include a second conductive portion 321 split from the first side surface 2111 of the first side surface member 211 by one or more non-conductive portions 3211 and 3212. According to an embodiment of the disclosure, the second conductive portion 321 may be disposed to be split by a third non-conductive portion 3211 and a fourth non-conductive portion 3212 spaced apart from each other by a predetermined interval and may be electrically connected to the wireless communication module (e.g., the wireless communication module 192 in FIG. 1). According to an embodiment of the disclosure, the wireless communication circuit (e.g., the wireless communication module 192 in FIG. 1) may be configured to transmit and/or receive a wireless signal in a predetermined frequency band (e.g., about 800 MHz to 6000 MHz) (e.g., a legacy band) via the first conductive portion 311 and/or the second conductive portion 312. In some embodiments of the disclosure, the electronic device 200 may further include at least one antenna module (e.g., a 5G antenna module or an antenna structure) disposed in the inner space (e.g., the first space 2101 or the second space 2201) and configured to transmit and receive a wireless signal of a frequency band ranging from about 3 GHz to 100 GHz via another wireless communication circuit (e.g., the wireless communication module 192 in FIG. 1).

The electronic device 200 according to embodiments of the disclosure may include a drive module (e.g., the drive module 400 of FIG. 4) disposed in the inner space (e.g., the second space 2201) for the slid-in/out operation. According to an embodiment of the disclosure, the electronic device 200 may use a push-pull operation as a triggering operation for driving the drive module (e.g., the drive module 400 of FIG. 4). For example, when detecting a triggering operation in which the second housing 200 is pressed by a push-pull section to the direction where the second housing is to be slid in (e.g., direction ②) when the drive module (e.g., the drive module 400 in FIG. 4) is not driven and the electronic device 200 is in the slide-in state, the electronic device 200 may automatically cause the second housing 220 to be slid out (a push and pull-out operation) (e.g., the slide-out operation) by the drive module (e.g., the drive module 400 in FIG. 4). According to an embodiment of the disclosure, when detecting a triggering operation in which the second housing 220 is pressed by a push-pull section to the direction where the second housing 220 is to be slid in (e.g., direction ②) when the drive module (e.g., the drive module 400 in FIG. 4) is not driven and the electronic device 200 is in the slide-out state, the electronic device 200 may automatically cause the second housing 200 to be slid in (a push and pull-in operation) (e.g., the slide-in operation) by the drive module (e.g., the drive module 400 in FIG. 4). Accordingly, the electronic device 200 may provide an intuitive and new experience to a user and help improve convenience in use by providing an intuitive triggering mechanism (switching mechanism) for the slide-in/out operation.

FIG. 4 is an exploded perspective view of an electronic device according to an embodiment of the disclosure.

Referring to FIG. 4, an electronic device 200 may include a first housing 210, a second housing 220 slidably coupled to the first housing 210, a support member 240 (e.g., a multi-bar assembly) disposed to be at least partially rotatable in the second housing 220, and a flexible display 230 disposed to be supported by at least a portion of the support member 240 and the first housing 210. According to an embodiment of the disclosure, the first housing 210 may be provided by coupling a cover housing 214 and a bracket housing 215 (e.g., a front housing). In some embodiments of the disclosure, at least a portion of the cover housing 214 may include a first extension member (e.g., the first extension member 212 in FIG. 3B) or may be replaced by the first extension member 212.

According to various embodiments of the disclosure, the electronic device 200 may include a substrate 250 disposed in the space between the cover housing 214 and the bracket housing 215 (e.g., the first space 2101 in FIG. 3A) and at least one battery 2511 disposed near the substrate 250. According to an embodiment of the disclosure, the electronic device 200 may further include an additional bracket 215a disposed in the space between the cover housing 214 and the bracket housing 215 (e.g., the first space 2101 in FIG. 3A) and configured to support the substrate 250 or the at least one battery 2511.

According to various embodiments of the disclosure, one end of the support member 240 may be fixed to the first housing 210 and the other end may be disposed to be at least partially movably accommodated in the inner space of the second housing 220 (e.g., the second space 2201 in FIG. 3A). For example, in the slide-in state, the support member 240 may be at least partially accommodated in the inner space of the second housing 220, and in the slide-out state, the support member 240 may be at least partially slid out from the inner space of the second housing 220 to define a substantially same plane as the first housing 210 (e.g., the bracket housing 215). Accordingly, in the flexible display 230, which is supported by at least a portion of the first housing 210 and the support member 240, the display area visible from the outside may be changed depending on the sliding operation.

According to various embodiments of the disclosure, the electronic device 200 may include a sliding frame 260 coupled to the second housing 220. According to an embodiment of the disclosure, the sliding frame 260 may be slidably coupled to the first housing 210 (e.g., the bracket housing 215). According to an embodiment of the disclosure, the sliding frame 260 may include a plate 261 slidably coupled to the first housing 210 (e.g., the bracket housing 215), and a sliding bar 262 extending from the plate portion 261 and configured to presses the rear surface of the support member 240. In some embodiments of the disclosure, the plate 261 and the sliding bar 262 may be provided separately and structurally coupled. According to an embodiment of the disclosure, the sliding frame 260 may be included in the second housing 220. For example, the sliding frame 260 may be integrated with the second housing 220. According to an embodiment of the disclosure, when provided as a portion of the second housing 220, the sliding frame 260 member may be omitted.

According to various embodiments of the disclosure, the electronic device 200 may include a drive module 400. According to an embodiment of the disclosure, the drive module 400 may include a drive motor (e.g., a drive motor 410 in FIG. 5) disposed on the sliding frame 260 and including a pinion gear (e.g., the pinion gear 411 in FIG. 5), and a rack gear structure (e.g., a rack gear structure 420 in FIG. 5) disposed in the bracket housing 215 and including a rack gear (e.g., rack gears 421 in FIG. 5) gear-engaged (e.g., meshed) with the pinion gear 411. According to an embodiment of the disclosure, the rack gear structure 420 may be arranged to be movable by a predetermined section (e.g., a push-pull section) along sliding directions (e.g., the x-axis and the −x-axis) in the bracket housing 215. For example, when the drive motor 410 is not driven and the sliding frame 260 (e.g., the second housing 220) is pressed to the direction where the sliding frame 260 is to be slid in in the state in which the pinion gear 411 and the rack gear 421 are engaged with each other, by the back drive force of the drive motor 410, the pinion gear 411 may not rotate, and the drive motor 410 and the rack gear structure 420 may be moved by a predetermined section to the direction where the drive motor 410 and the rack gear structure 420 are to be slid in with the second housing 220. By driving the drive motor 411 by using the movement of the second housing 220 detected by using the back drive force of the drive motor 410 as a triggering operation (e.g., a switching operation for changing to a slide-in/slide-out state), the electronic device 200 may be automatically changed to the slide-in state or the slide-out state.

According to various embodiments of the disclosure, the electronic device 200 may include a movement distance detection sensor 500 disposed in the first housing 210. According to an embodiment of the disclosure, the movement distance detection sensor 500 may include a magnetic force detection sensor configured to detect the magnetic force of at least one magnet (e.g., the magnet M in FIG. 7) disposed at a corresponding position in the second housing 220. In some embodiments of the disclosure, the movement distance detection sensor 500 may include a capacitance sensor (e.g., a touch sensor) configured to detect at least one conductive member or dielectric structure disposed in the second housing 220. In some embodiments of the disclosure, the movement distance detection sensor 500 may include an optical sensor (e.g., a proximity sensor) configured to recognize multiple holes or markers disposed or provided in the second housing.

Hereinafter, the drive module 400 and the movement distance detection sensor 500 will be described below.

Figure 5:
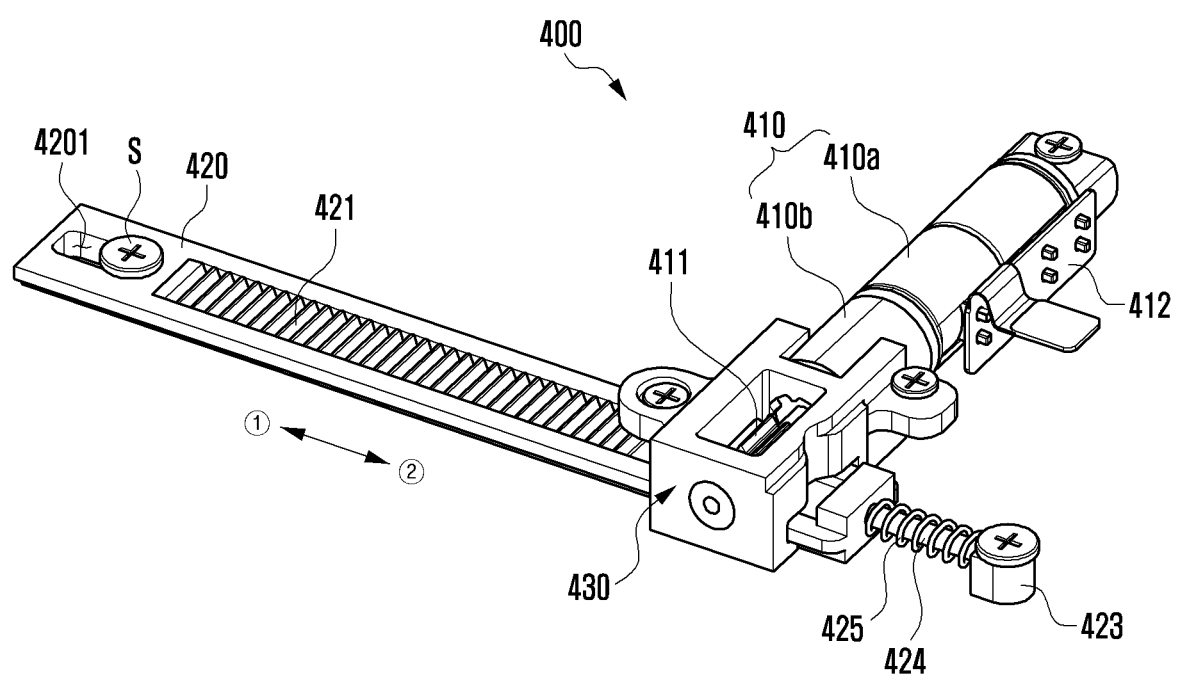
FIG. 5 is a perspective view of a drive module according to an embodiment of the disclosure.
Figure 6:
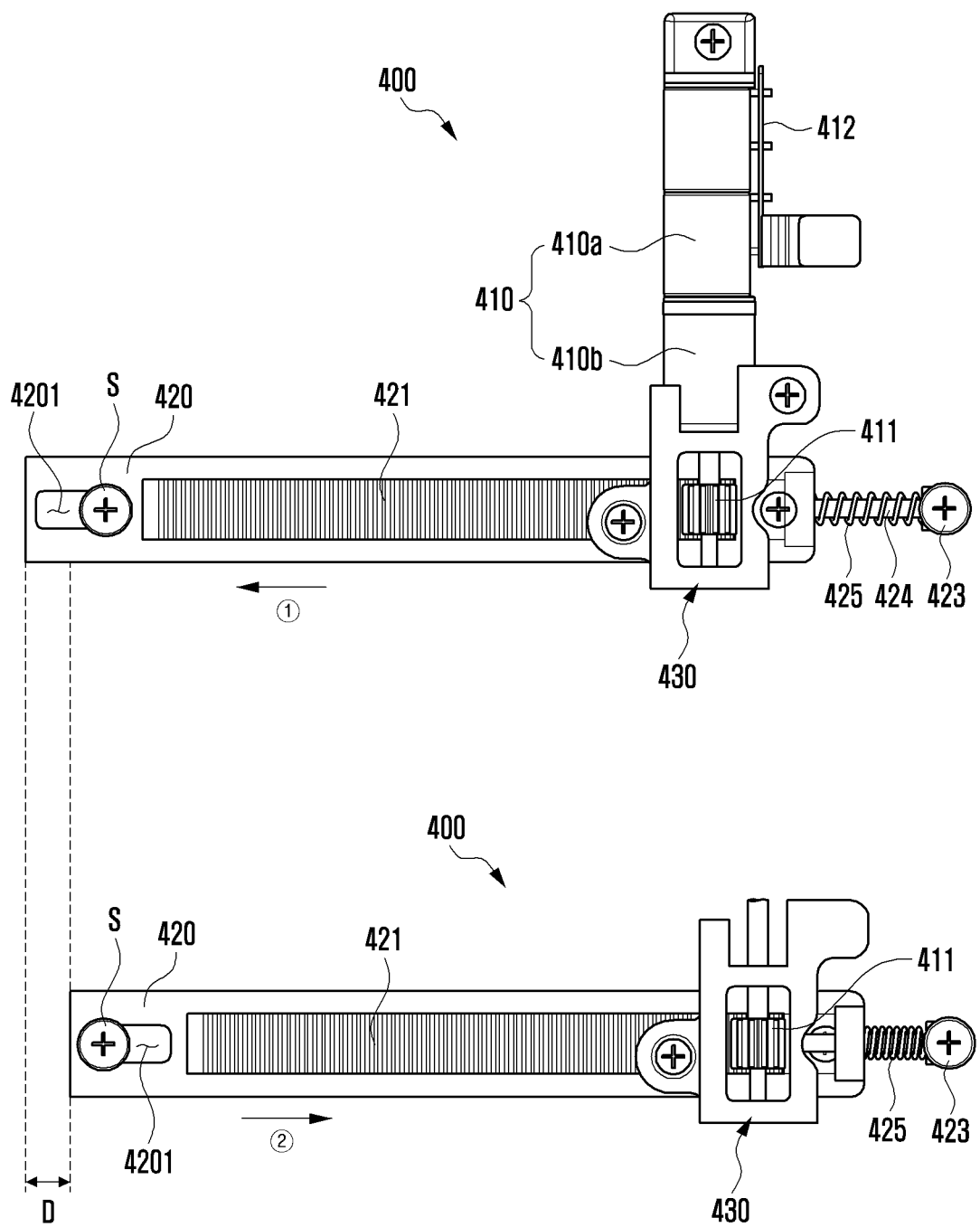
FIG. 6 is view illustrating a state in which a rack gear structure moves by using a back drive force of a drive motor according to an embodiment of the disclosure.

FIG. 5 is a perspective view of a drive module according to an embodiment of the disclosure. FIG. 6 illustrates a state in which a rack gear structure moves by using a back drive force of a drive motor according to an embodiment of the disclosure.

Referring to FIG. 5, the drive module 400 may include a drive motor 410 including a pinion gear 411 and a rack gear structure 420 including a rack gear 421 engaged with the pinion gear 411. According to an embodiment of the disclosure, the drive motor 410 may be fixed to the sliding frame (e.g., the sliding frame 260 in FIG. 4) via a motor bracket 430. According to an embodiment of the disclosure, the drive motor 410 may include, for example, a motor unit 410a and a reduction unit 410b (e.g., a reduction module) coupled to the motor unit 410a and including a multi-gear assembly configured to reduce the number of rotations of the motor unit 410a and to increase the rotation force of the motor unit 410a. According to an embodiment of the disclosure, the pinion gear 411 is, for example, a pinion gear, and may be fixed via a shaft installed to be rotatable about a predetermined rotary axis by the drive motor 410. According to an embodiment of the disclosure, the drive motor 410 may be electrically connected to a substrate (e.g., the substrate 250 in FIG. 4) of an electronic device (e.g., the electronic device 200 in FIG. 4) through a motor FPCB 412. According to an embodiment of the disclosure, the rack gear structure 420 may be coupled to a bracket housing (e.g., the bracket housing 215 in FIG. 4). According to an embodiment of the disclosure, the rack gear structure 420 may include a rack gear 421 fabricated in a plate type having a length and configured to be engaged with the pinion gear 411 on a surface corresponding to the pinion gear 411. According to an embodiment of the disclosure, when the drive motor 410 rotates the pinion gear 411, through a gearing operation via the rack gear 421 coupled therewith, the sliding frame (e.g., the sliding frame 260 of FIG. 4) to which the drive motor is coupled may be moved to the slide-out direction (direction ①) or the slide-in direction (direction ②). Therefore, the second housing (the second housing 220 in FIG. 4) coupled with the sliding frame 260 including the drive motor 410 may be moved to the slide-out direction (direction ①) or the slide-in direction (direction ②) from the first housing (e.g., the first housing 210 in FIG. 4) in which the bracket housing (e.g., the bracket housing 215 in FIG. 4) including the rack gear structure 420 and the cover housing (e.g., the cover housing 214 in FIG. 4) are coupled.

Referring to FIG. 6, the rack gear structure 420 may be arranged in the bracket housing (e.g., the bracket housing 215 of FIG. 4) to be capable of reciprocating by a predetermined section along the slide-out direction (direction ①) and the slide-in direction (direction ②). For example, a predetermined reciprocating section D may be substantially the same as the push-pull section D according to an embodiment of the disclosure. According to an embodiment of the disclosure, the rack gear structure 420 may include a guide hole 4201 that has a length on one side of the rack gear 421 and a guide screw S that passes through the guide hole 4201 and is fixed to the bracket housing 215. According to an embodiment of the disclosure, when the second housing (e.g., the second housing 220 in FIG. 4) is moved by the push-pull section D to the slide-in direction (direction ②) in the state the drive motor 410 is not driven, by the back drive force of the drive motor 410, the pinion gear 411 may not rotate, and the rack gear structure 420 may be moved to the slide-in direction (direction ②) while the rack gear 421 does not rotate as well. In this case, the rack gear structure 420 may be limited in its movement distance to be movable only by the predetermined push-pull section D by the guide structure of the guide hole 4201 and the guide screw S penetrating the same. This may help prevent an erroneous operation in which the second housing 220 is excessively slid in beyond the push-pull section D.

According to various embodiments of the disclosure, the drive module 400 may include a suspension 425 configured to pressurize the rack gear structure 420 to the slide-out direction. According to an embodiment of the disclosure, the drive module 400 may include a support 423 fixed to the bracket housing 215, a guide shaft 424 fixed to the support 423 and configured to guide the rack gear structure 420, and a suspension 425 (e.g., a coil spring) disposed between the rack gear structure 420 and the support 423 so that the guide shaft 424 passes through the suspension and configured to press the rack gear structure 420 to the slide-out direction (direction ①) while being supported by the support 423. In some embodiments of the disclosure, the suspension 425 may be understood to include both the support 423 and the guide shaft 424. According to an embodiment of the disclosure, the suspension 425 may assist the driving force of the drive motor 410 to move the rack gear structure 420, which has been moved to the slide-in direction (direction ②) by the push-pull section D for the triggering operation, to the slide-out direction (direction ①) again in the state in which the drive motor 410 is not driven. In some embodiments of the disclosure, the suspension 425 may assist the driving force of the drive motor 410 for moving the rack gear structure 420 back to its original position in a malfunctioning state in which the second housing 220 is moved by a section smaller than the push-pull section D to the slide-in direction (direction ②).

Figure 7:
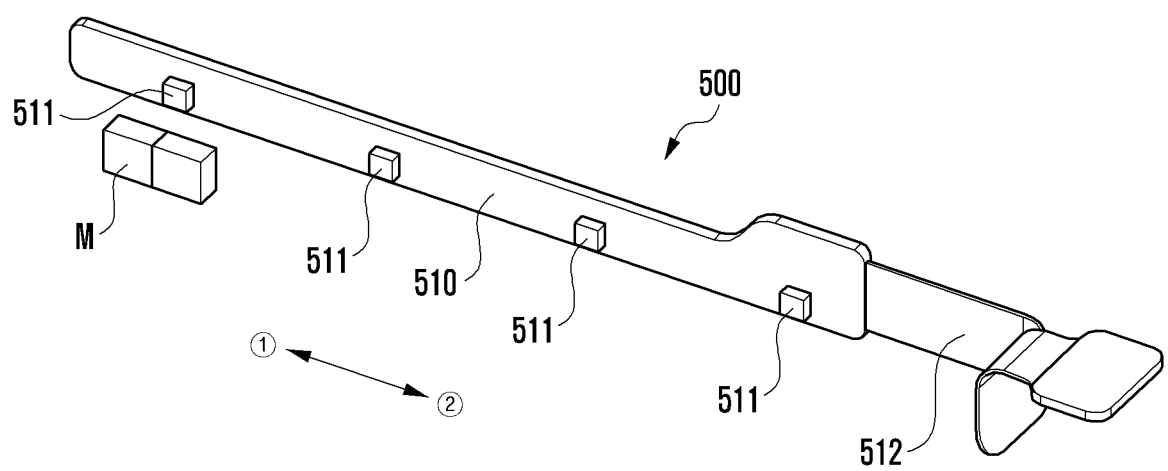
FIG. 7 is a perspective view of a movement distance detection sensor according to an embodiment of the disclosure.

FIG. 7 is a perspective view of a movement distance detection sensor according to an embodiment of the disclosure.

Referring to FIG. 7, the movement distance detection sensor 500 may include a sensor substrate 510 disposed in a bracket housing (e.g., the bracket housing 215 in FIG. 4) included in a first housing (e.g., the first housing 210 in FIG. 4) and one or more sensor modules 511 arranged on the sensor substrate 510. According to an embodiment of the disclosure, the sensor substrate 510 may be disposed to have a length in a direction parallel to a direction in which the second housing (e.g., the second housing 220 of FIG. 4) is moved. According to an embodiment of the disclosure, the sensor substrate 510 may include at least one of a rigid substrate (e.g., a printed circuit board (PCB)) or a flexible printed circuit board (FPCB). According to an embodiment of the disclosure, the movement distance detection sensor 500 may include a connector 512 (e.g., an FPCB connector or a wiring member) extending from the sensor substrate 510 and electrically connected to a substrate (e.g., the substrate 250 of FIG. 4) disposed in the first housing 210. According to an embodiment of the disclosure, the one or more sensor modules 511 may include one or more Hall sensor configured to detect the magnetic force of at least one magnet M disposed on a sliding frame (e.g., the sliding frame 260 of FIG. 4). According to an embodiment of the disclosure, the movement distance detection sensor 500 may detect the sliding distance of the second housing 220 moving from the first housing 210. According to an embodiment of the disclosure, the movement distance detection sensor 500 may detect the movement distance of the second housing 220 moved to the slide-in direction (direction ②) by the push-pull section D for a triggering operation. In some embodiments of the disclosure, the electronic device (e.g., the electronic device 200 of FIG. 4) may further include a separate detection sensor configured to detect a sliding distance for slide-in/out of the second housing 220 from the first housing 210, in addition to the movement distance detection sensor 500 configured to detect the movement of the second housing 220 by the push-pull section D. In some embodiments of the disclosure, the movement distance detection sensor 500 may include a capacitance sensor (e.g., a touch sensor) configured to detect at least one conductive member or dielectric structure disposed in the second housing 220. In some embodiments of the disclosure, the movement distance detection sensor 500 may include an optical sensor (e.g., a proximity sensor) configured to recognize multiple holes or markers disposed or provided in the second housing 220.

Figure 8A:
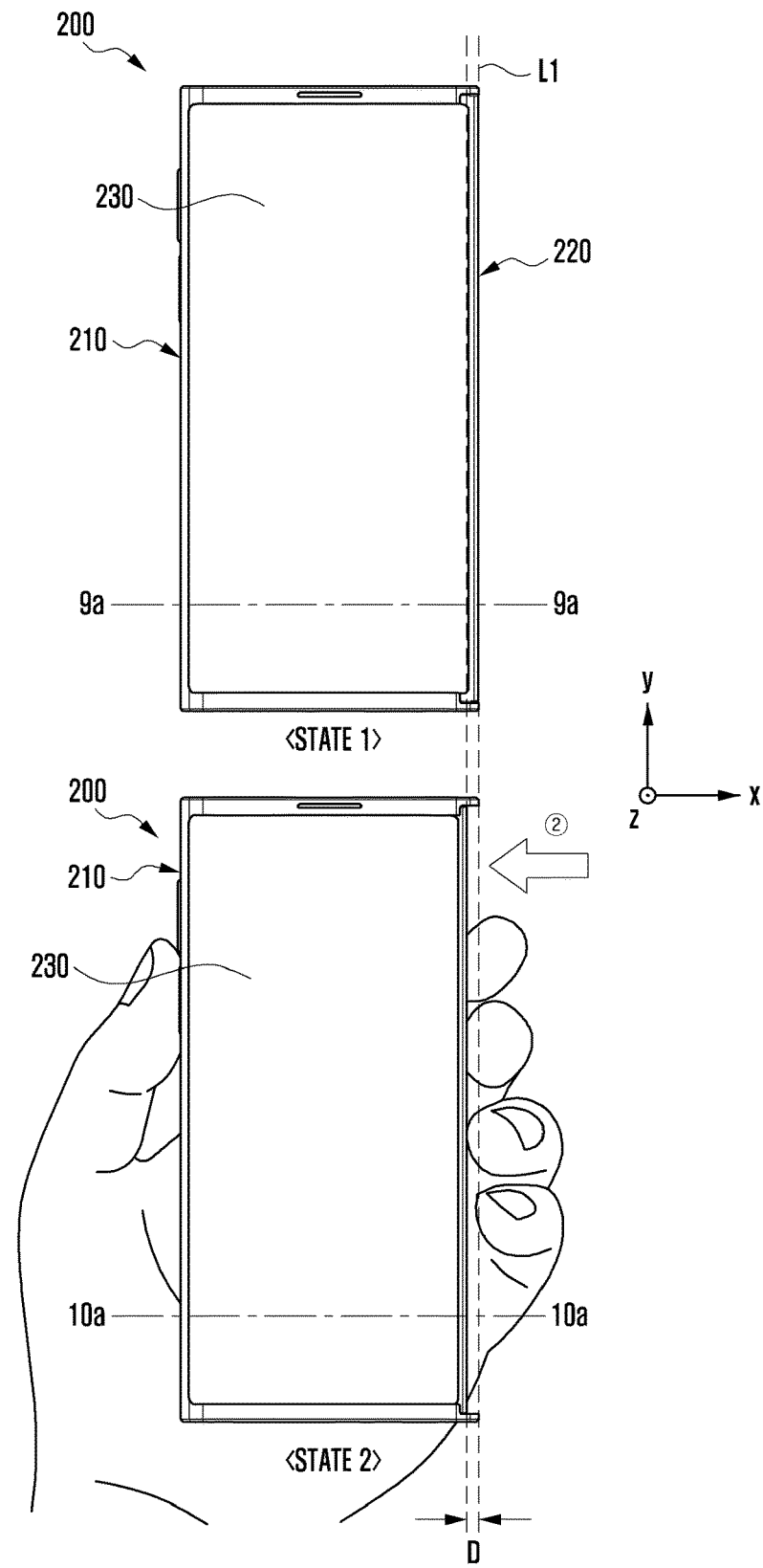
FIGS. 8A and 8B are views illustrating the operating states of an electronic device through a push-pull triggering operation according to various embodiments of the disclosure.
Figure 8B:
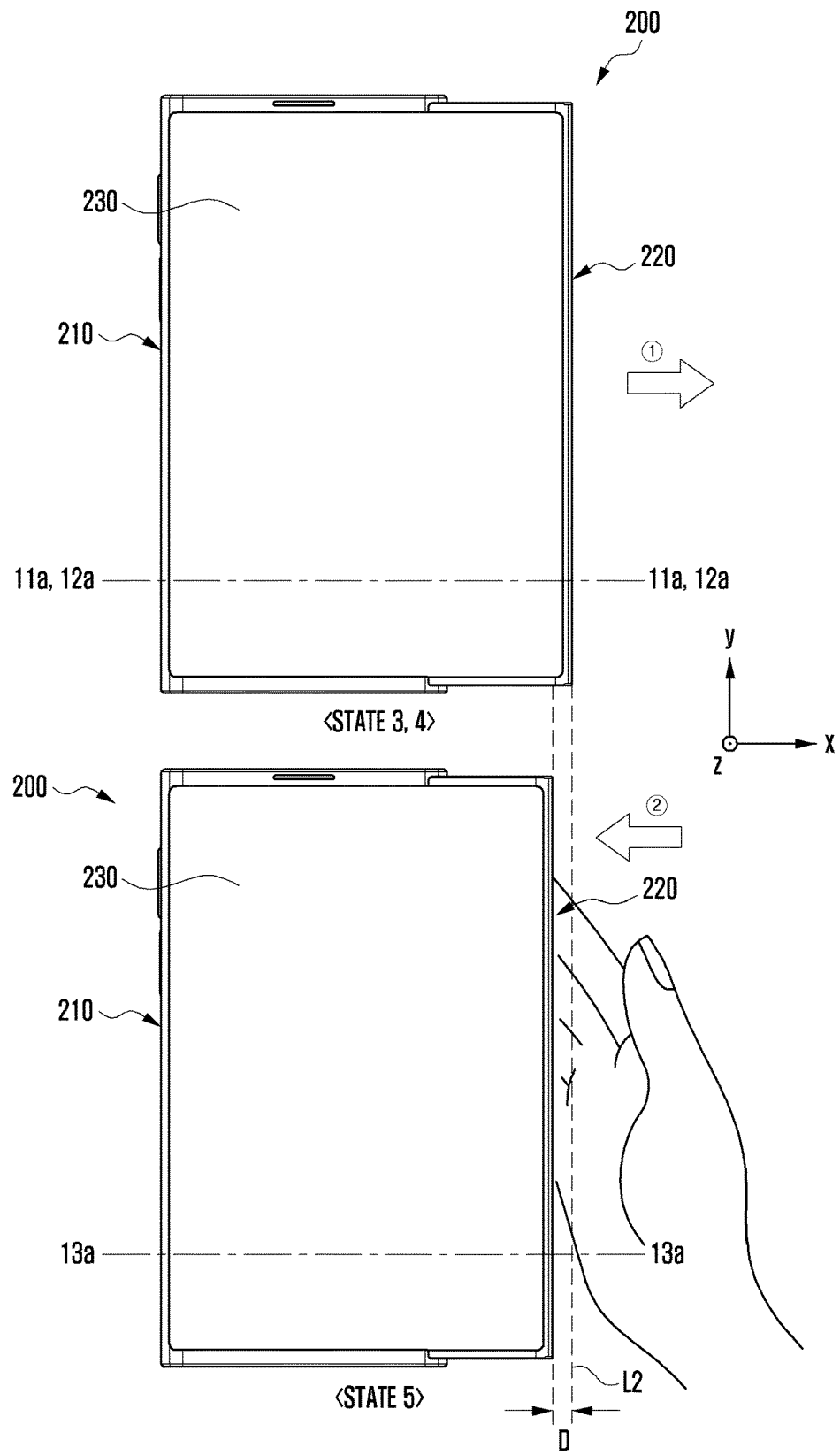

FIGS. 8A and 8B are views illustrating the operating states of an electronic device through a push-pull triggering operation according to various embodiments of the disclosure.

Referring to FIGS. 8A and 8B, state 1 may refer to a slide-in state of the electronic device 200. State 2 may refer to state in which the electronic device 220 is moved by the push-pull section D to the slide-in direction (direction ②) by a user's manipulation from the slide-in state of the electronic device 220. State 3 may refer to a slide-out state of the electronic device 200. State 4 may refer to a state in which the rack gear structure 420 is moved by driving the drive motor (e.g., the drive motor 410 of FIG. 5) in the slide-state of the electronic device 200. State 5 may refer to state in which the second housing 220 is moved by the push-pull section D to the slide-in direction (direction ②) by a user's manipulation from the slide-out state of the electronic device 200.

According to various embodiments of the disclosure, the electronic device may be changed from the slide-in state of state 1 to state 2 in which the second housing 220 is pressed to be slid in by the push-pull section D to the slide-in direction (direction ②) through the user's manipulation. For example, the push-pull section D may refer to the section in which the second housing 220 is moved by a predetermined distance to the slide-in direction (direction ②) from a first reference line L1 when the electronic device 200 is in the slide-in state. In state 2, the second housing 220 may be changed to the slide-out state of state 3 by being automatically slid out from the first housing 210 through the driving of the drive module (e.g., the drive module 400 of FIG. 5). For example, state 3 may be a state in which the suspension 425 is pressed. In state 4, the second housing 220 may maintain the slide-out state, but in state 3, the rack gear structure 420 may be moved through the driving of an internal drive motor (e.g., the drive motor 410 of FIG. 5) and the suspension 425 may be in a relaxed state. The electronic device 200 may be changed from the slide-out state of state 4 to state 5 in which the second housing 220 is pressed to be slid in by the push-pull section D to the slide-in direction (direction ②) through the user's manipulation. For example, the push-pull section D may refer to the section in which the second housing 200 is moved by a predetermined distance to the slide-in direction (direction ②) from a second reference line L2 is in the slide out state 200. Therefore, the second housing 220 may be changed back to state 1 by being automatically slid into the first housing 210 through the driving of the drive module (e.g., the drive module 400 of FIG. 5).

Hereinafter, the internal structure of the electronic device 200 for each state will be described below.

Figure 9A:
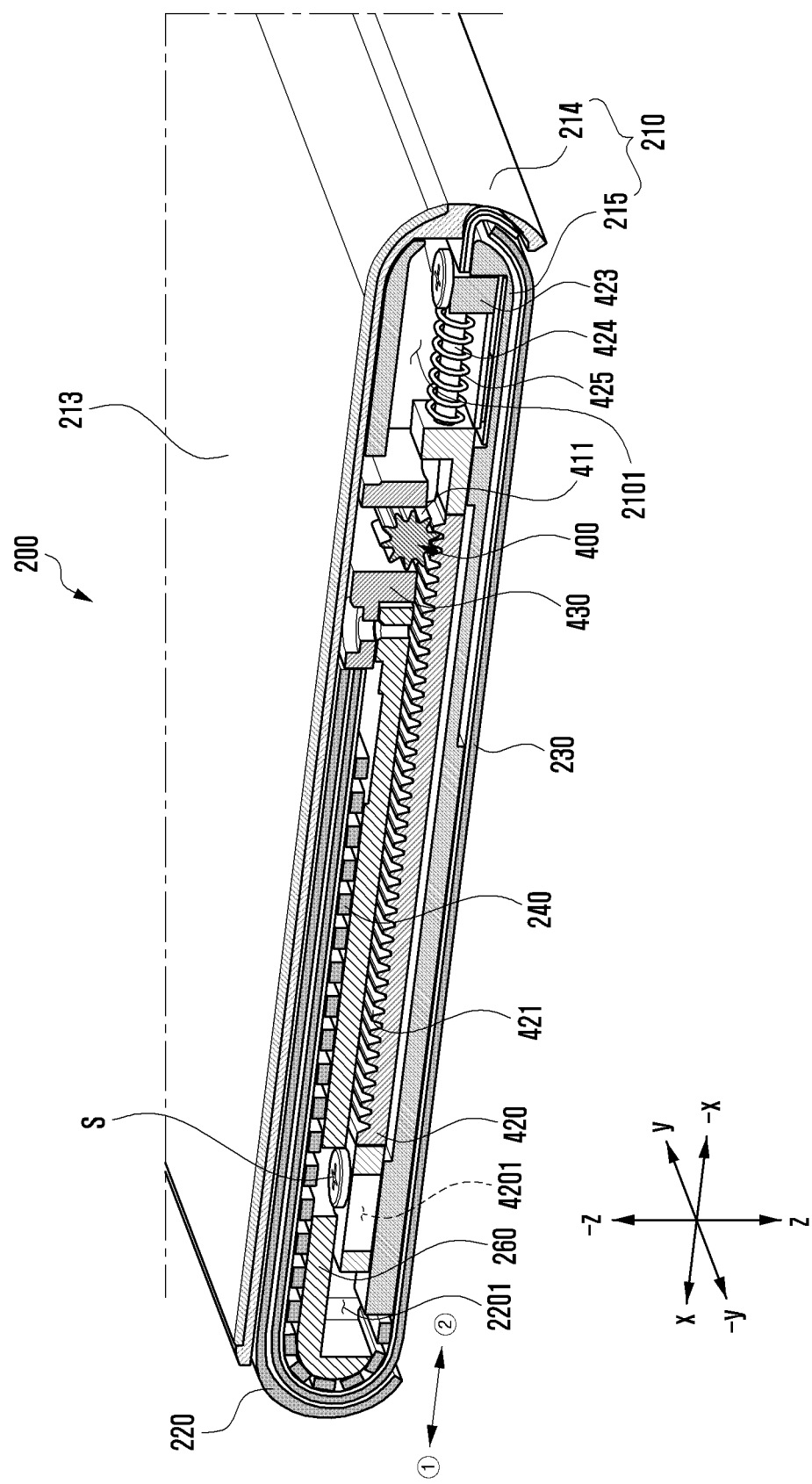
FIGS. 9A and 9B are a perspective view and a cross-sectional view obtained by viewing a cross section of an electronic device taken along line 9a-9a of FIG. 8A in state 1 according to various embodiments of the disclosure.
Figure 9B:
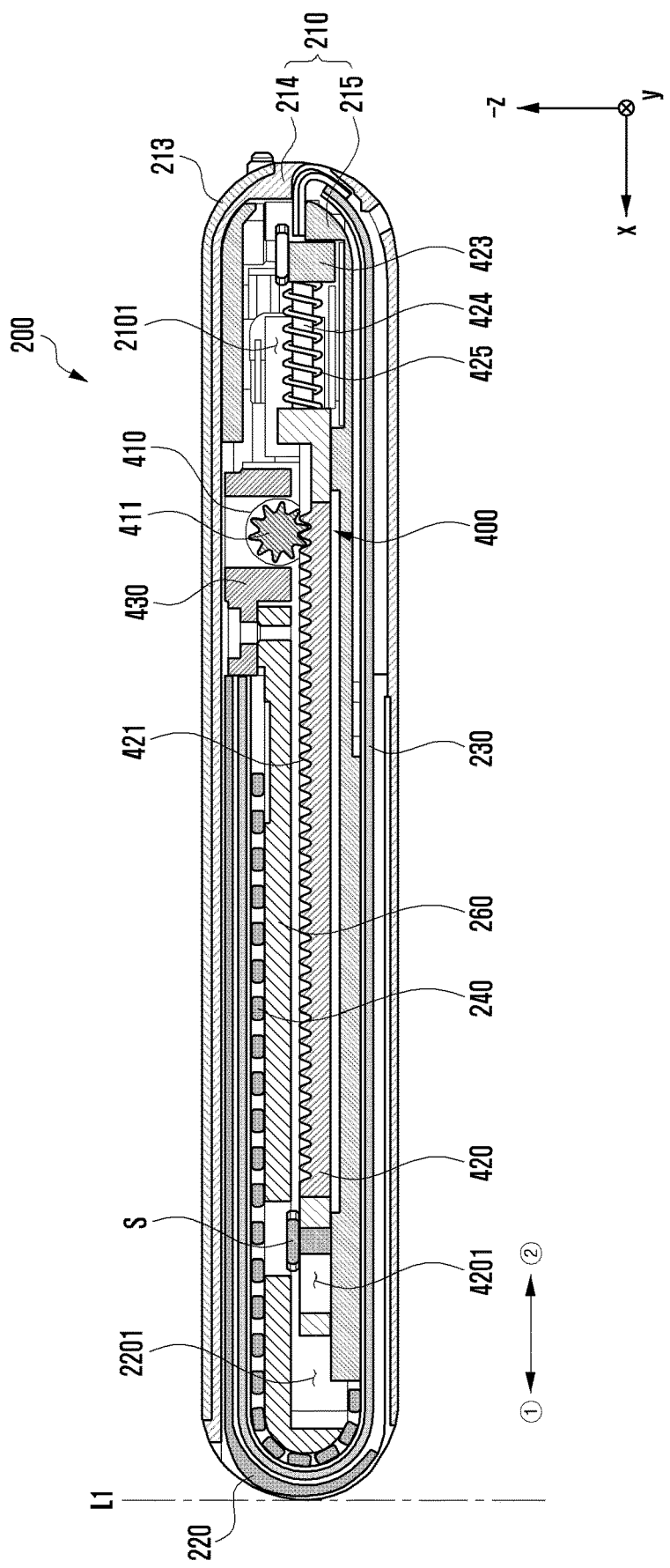
Figure 9C:
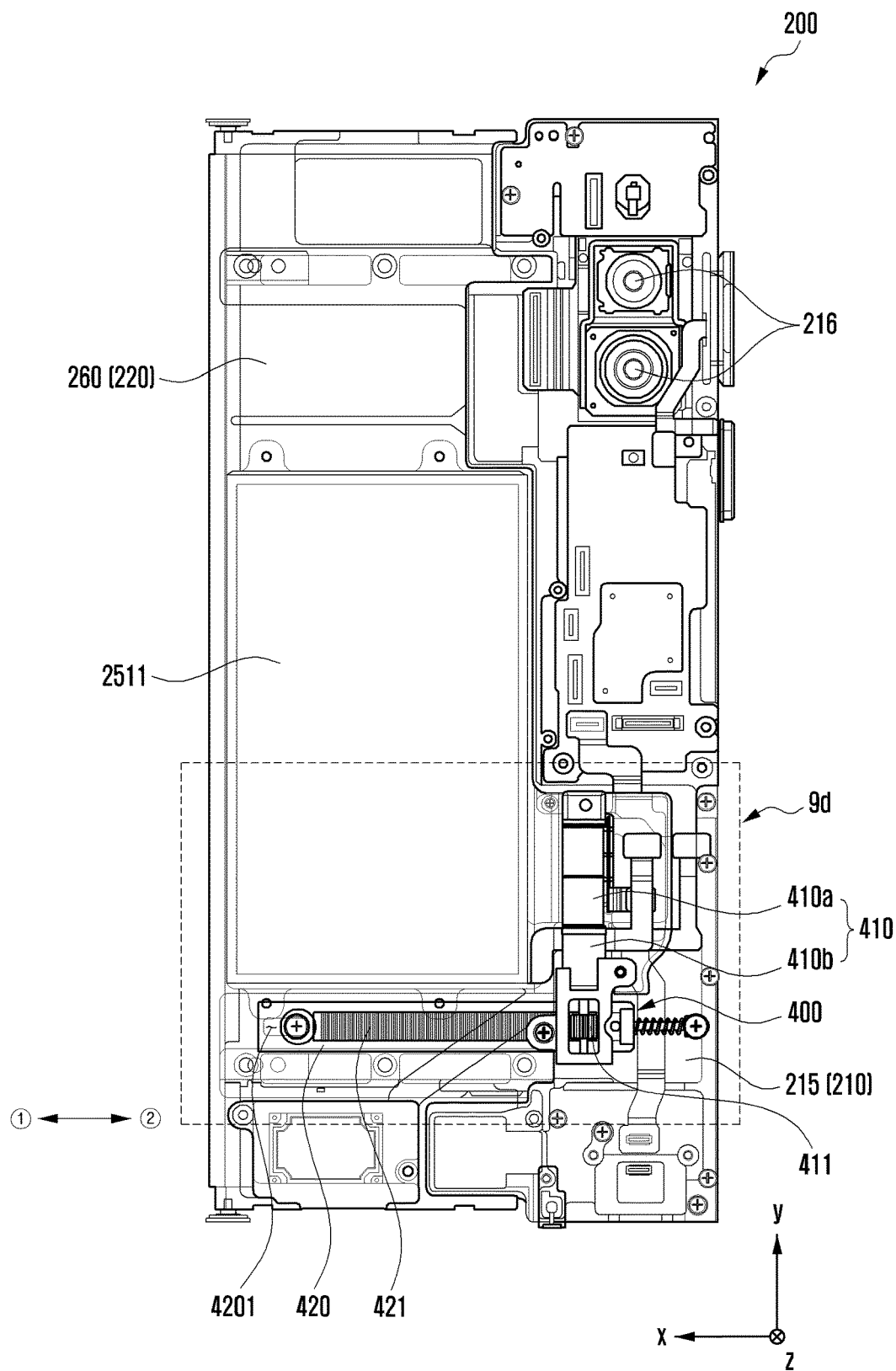
FIG. 9C is a view schematically illustrating the electronic device illustrated in FIG. 9A according to an embodiment of the disclosure.
Figure 9D:
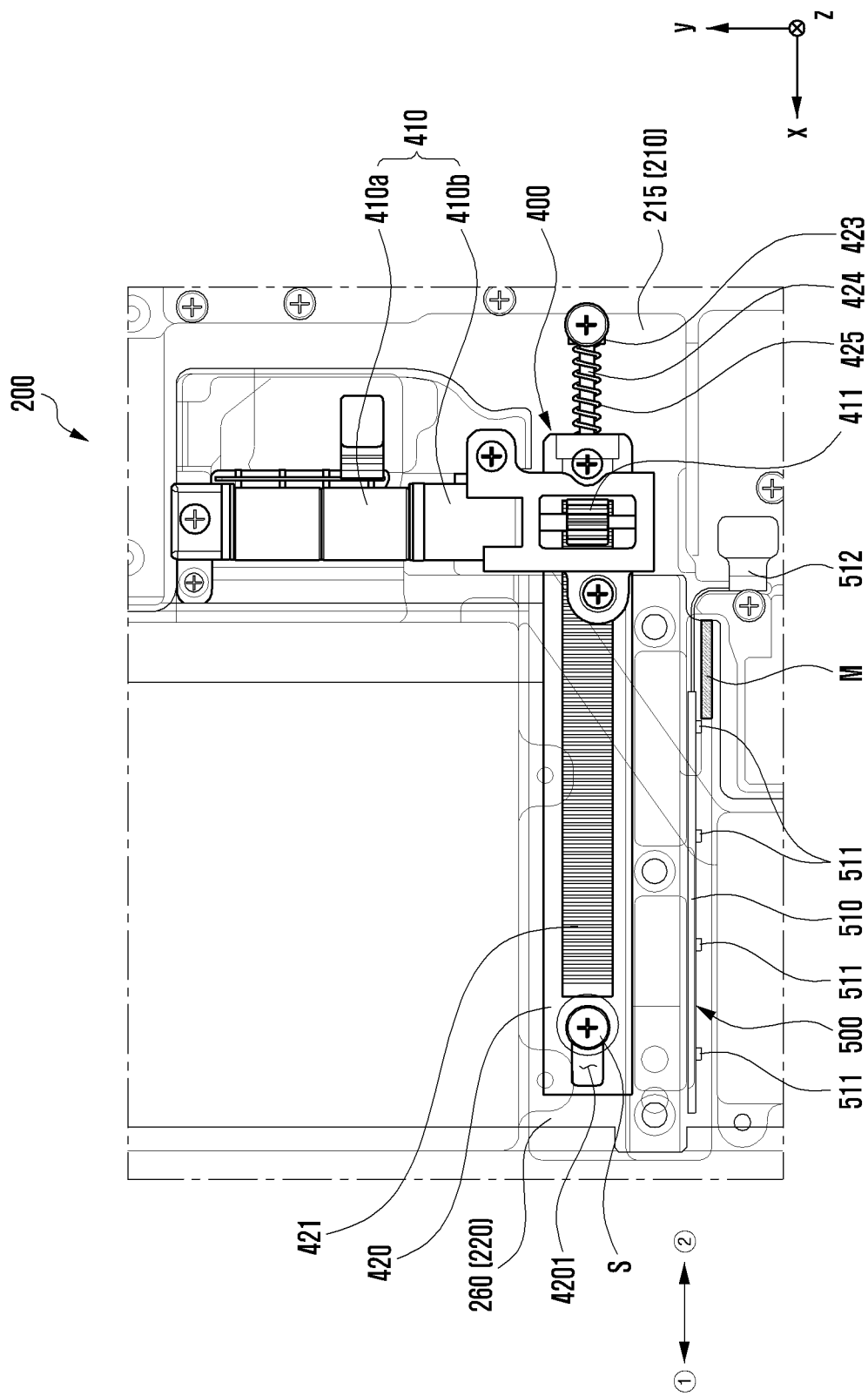
FIG. 9D is an enlarged view of area 9d of FIG. 9C according to an embodiment of the disclosure.

FIGS. 9A and 9B are a perspective view and a cross-sectional view obtained by viewing a cross section of an electronic device taken along line 9a-9a of FIG. 8A in state 1 according to various embodiments of the disclosure. FIG. 9C is a view schematically illustrating the electronic device illustrated in FIG. 9A according to an embodiment of the disclosure. FIG. 9D is an enlarged view of area 9d of FIG. 9C according to an embodiment of the disclosure.

Referring to FIGS. 9A to 9D, an electronic device 200 may include a first housing 210 including a first space 2101, a second housing 220 slidably coupled to the first housing 210 and including a second space 2201, a support member 240 (e.g., a multi-bar assembly) disposed in the second space 2201 to be at least partially rotatable, and a flexible display 230 disposed to be supported by 210 by at least a portion of the support member 240 and the first housing 210. According to an embodiment of the disclosure, at least a portion of the first space 2101 may be provided by coupling a cover housing 214 and a bracket housing 215 (e.g., a front housing). In some embodiments of the disclosure, at least a portion of the cover housing 214 may include a first extension member (e.g., the first extension member 212 in FIG. 3B) or may be replaced by the first extension member 212.

According to various embodiments of the disclosure, the electronic device 200 may include a sliding bracket 260 coupled to the second housing 220. According to an embodiment of the disclosure, the sliding bracket 260 may be slidably coupled to the bracket housing 215. In some embodiments of the disclosure, at least a portion of the second space 2201 may be provided through the structural design of the sliding bracket 260. According to an embodiment of the disclosure, one end of the support member 240 may be fixed to the first housing 210 and the other end may be disposed to be at least partially movably accommodated in the second space 2201 of the second housing 220. For example, in the slide-in state, the support member 240 may be at least partially accommodated in the second space 2201, and in the slide-out state, the support member 240 may be at least partially slid out from the second space 2201 to define a substantially same plane as the first housing 210 (e.g., the bracket housing 215). Accordingly, in the flexible display 230, which is supported by at least a portion of the first housing 210 and the support member 240, the display area visible from the outside may be changed depending on the sliding operation. For example, in the slide-out state, the display area of the flexible display 230 may be expanded compared with that in the slide-on state.

According to various embodiments of the disclosure, the electronic device 200 may include a drive motor 410 disposed on the sliding frame 260. According to an embodiment of the disclosure, the electronic device 200 may include a rack gear structure 420 disposed in the bracket housing 215 slidably coupled to the sliding frame 260. For example, the rack gear structure 420 may be disposed to be movable to the slide-in/out direction (e.g., direction ②/direction ①) slides from the bracket housing 215 by a predetermined reciprocating section (e.g., the push-pull section D). According to an embodiment of the disclosure, the pinion gear 411 rotatably installed in the drive motor 410 may be engaged with the rack gear 421 of the rack gear structure 420. In this case, when the drive motor 410 is driven, the pinion gear 411 is movable along the rack gear 421. According to an embodiment of the disclosure, when the drive motor 410 is driven, the sliding frame 260 and the drive motor 410 are movable from the bracket housing 215 to the slide-in/out direction (e.g., direction ②/direction ①). Therefore, when the drive motor 410 is driven, the second housing 220 is movable from the first housing 210 to the slide-in/out direction (e.g., direction ②/direction ①). According to an embodiment of the disclosure, the suspension 425 may be disposed in the bracket housing 215 and arranged to press the rack gear structure 420 to the slide-out direction (direction ①). According to an embodiment of the disclosure, the movement distance of the rack gear structure 420 may be limited by the guide screw S penetrating the guide hole 4201 having a length equal to the push-pull section D. According to an embodiment of the disclosure, the movement distance detection sensor 500 may be mounted on the bracket housing 215 to have a length in the slide-in/out direction (e.g., direction ②/direction ①) and may detect the movement distance of the sliding frame 260 by detecting the magnetic force of the at least one magnet M disposed on the sliding frame 260 to correspond thereto.

According to various embodiments of the disclosure, in state 1 (e.g., state 1 of FIG. 8A), the electronic device 200 may maintain the slide-in state in which the second housing 220 is slid into the first space 2101 in the first housing 210. According to an embodiment of the disclosure, the suspension 425 may maintain a relaxed state while pressing the rack gear structure 420 to the slide-out direction (direction ①). In this case, since the second housing 220 is in a state in which the drive motor 410 is not driven while the pinion gear 411 and the rack gear 421 are engaged with each other, the back drive force, which does not rotate the drive motor 410 itself, may prevent the second housing 220 from being arbitrarily moved away from the first housing 210 and may continuously maintain the slide-in state.

Figure 10A:
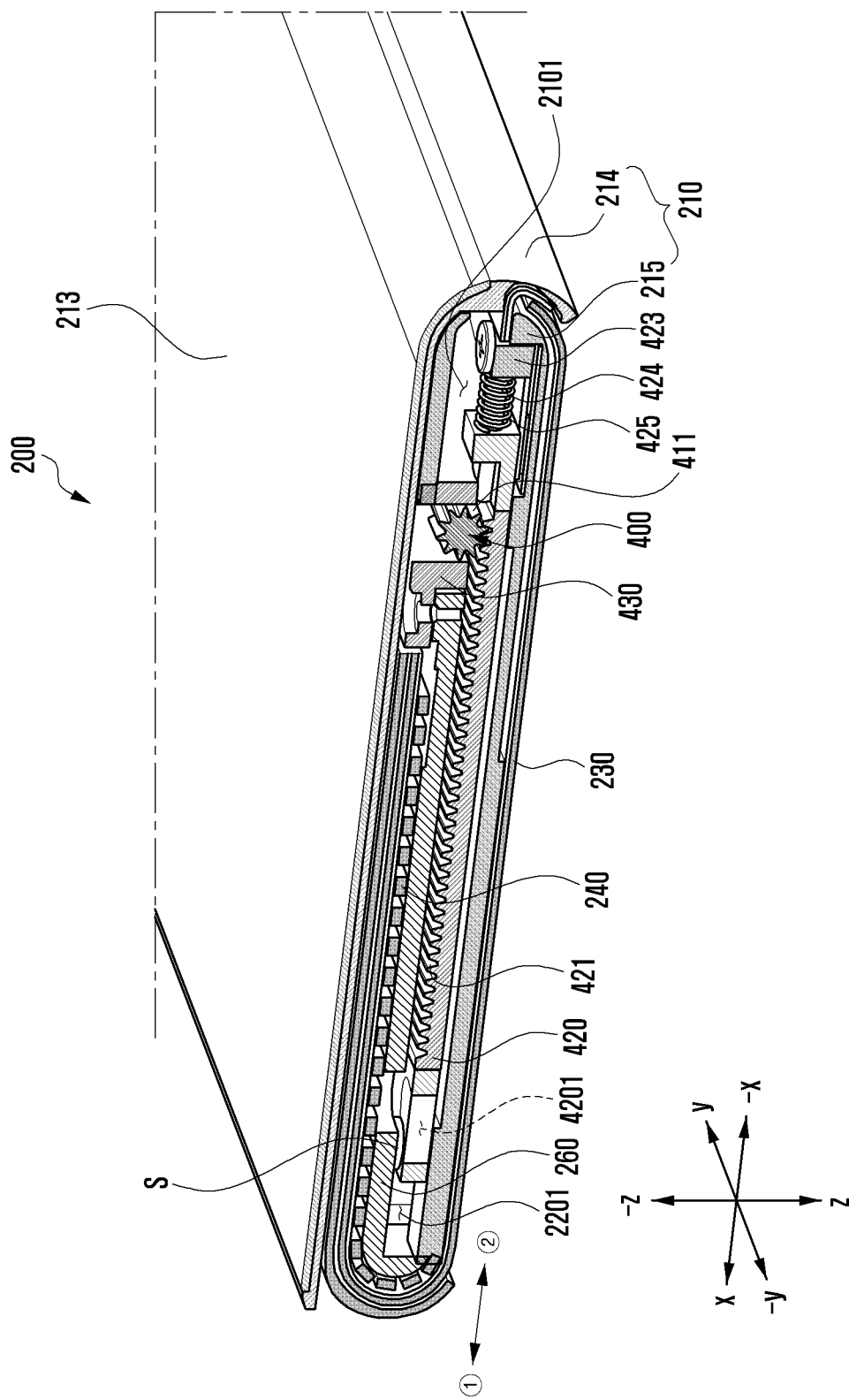
FIGS. 10A and 10B are views obtained by viewing a cross section of an electronic device taken along line 10a-10a of FIG. 8A in state 2 according to various embodiments of the disclosure.
Figure 10B:
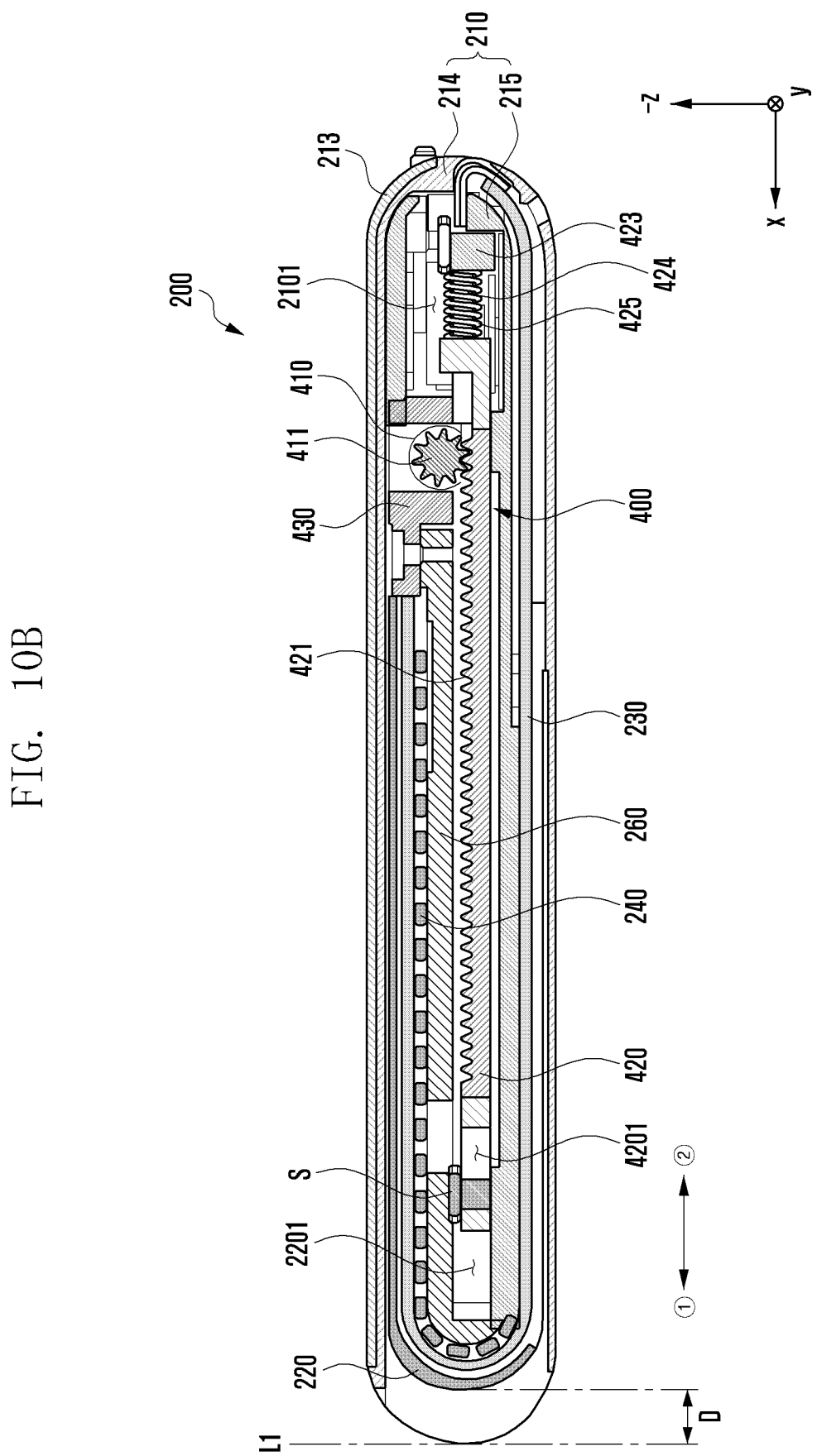
Figure 10C:
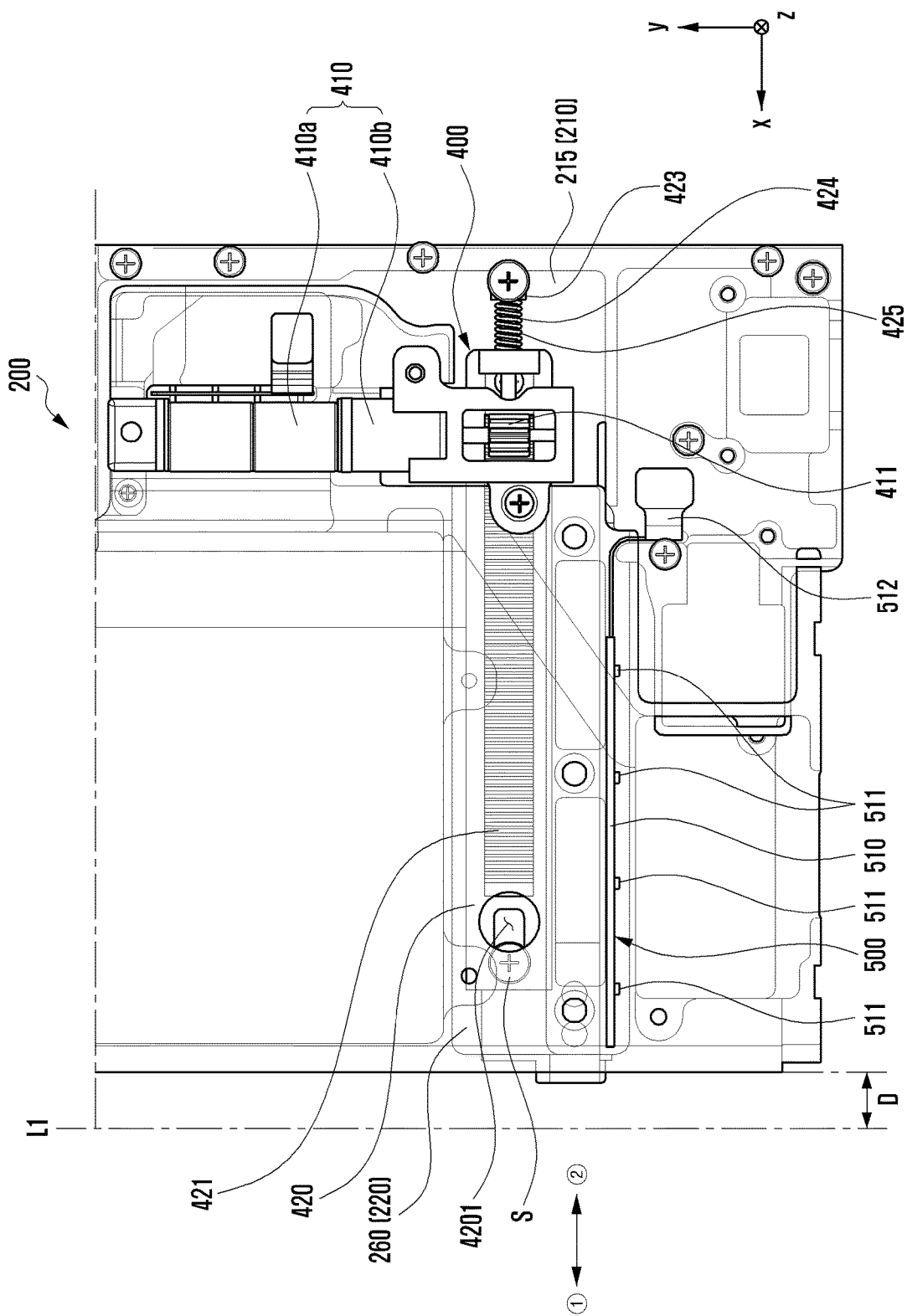
FIG. 10C is a view illustrating a configuration of a main part of the electronic device illustrated in FIG. 10A according to an embodiment of the disclosure.

FIGS. 10A and 10B are views obtained by viewing a cross section of an electronic device taken along line 10a-10a of FIG. 8A in state 2 according to various embodiments of the disclosure. FIG. 10C is a view illustrating a configuration of a main part of the electronic device illustrated in FIG. 10A according to an embodiment of the disclosure.

In describing the components of the electronic device 200 of FIGS. 10A to 10C, the same reference numerals are given to components that are substantially the same as those of the electronic device 200 of FIGS. 9A to 9D, and a detailed description thereof may be omitted.

Referring to FIGS. 10A to 10C, in state 2 (e.g., state 2 of FIG. 8A), the electronic device 200 (e.g., the processor 120 of FIG. 1) may detect a movement distance in which the second housing 220 is moved by the push-pull section D to the slide-in direction through the user's manipulation. For example, the push-pull section D may include a section in which the second housing 220 is further slid in by a predetermined distance to the slide-in direction beyond the first reference line L1 in the slide-in state of the electronic device 200. According to an embodiment of the disclosure, the electronic device 200 may detect the movement of the second housing 200 moved by the push-pull section D via the movement distance detection sensor 500. In this case, the drive motor 410 is not driven, and through the back drive force of the drive motor 410, the rack gear structure 420 including the rack gear 421 engaged with the pinion gear 411 may be moved with the second housing to the slide-in direction (e.g.; direction ②). According to an embodiment of the disclosure, the suspension 425 may retain elasticity through the movement of the rack gear structure 420 to the slide-in direction (e.g., direction ②) and may maintain a pressed state in which the suspension is contracted by the distance moved by the rack gear structure 420.

Figure 11A:
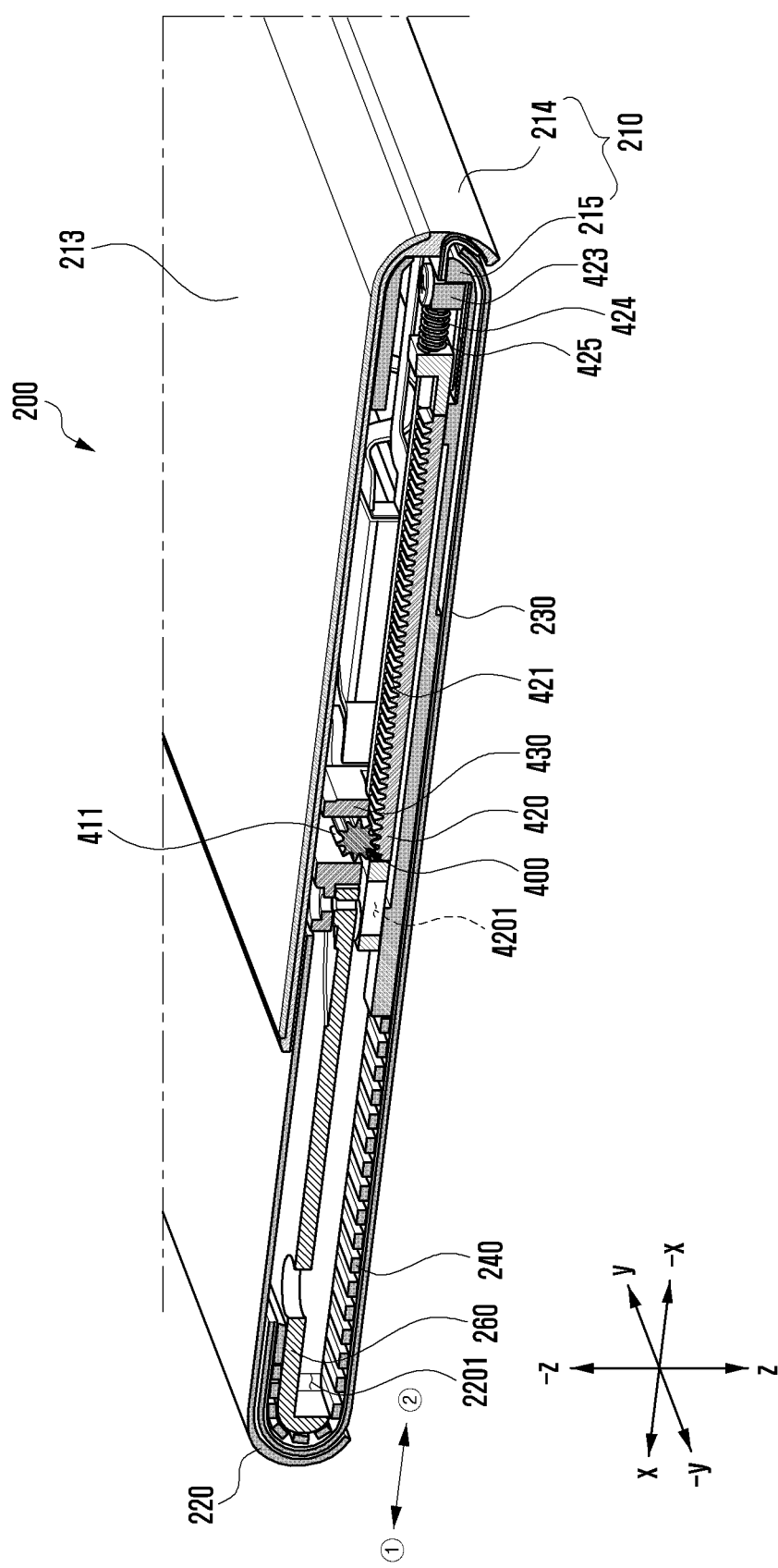
FIGS. 11A and 11B are views obtained by viewing a cross section of an electronic device taken along line 11a-11a of FIG. 8B in state 3 according to various embodiments of the disclosure.
Figure 11B:
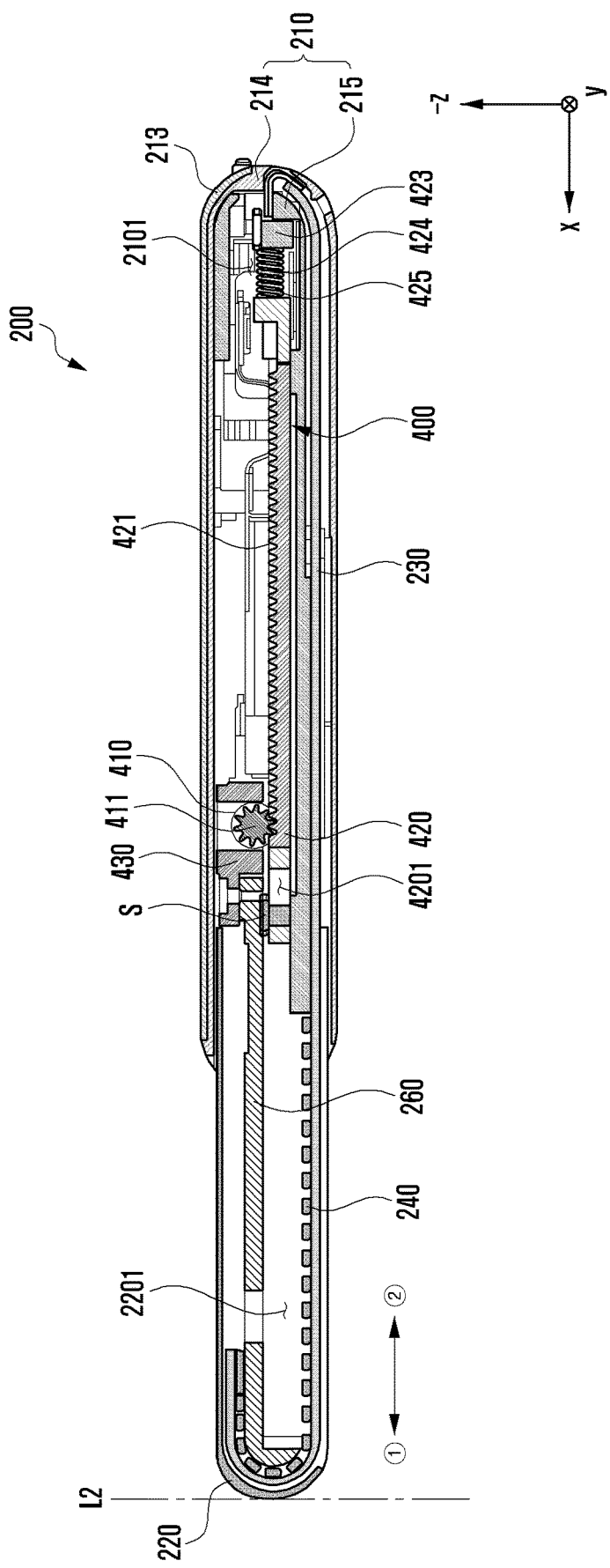
Figure 11C:
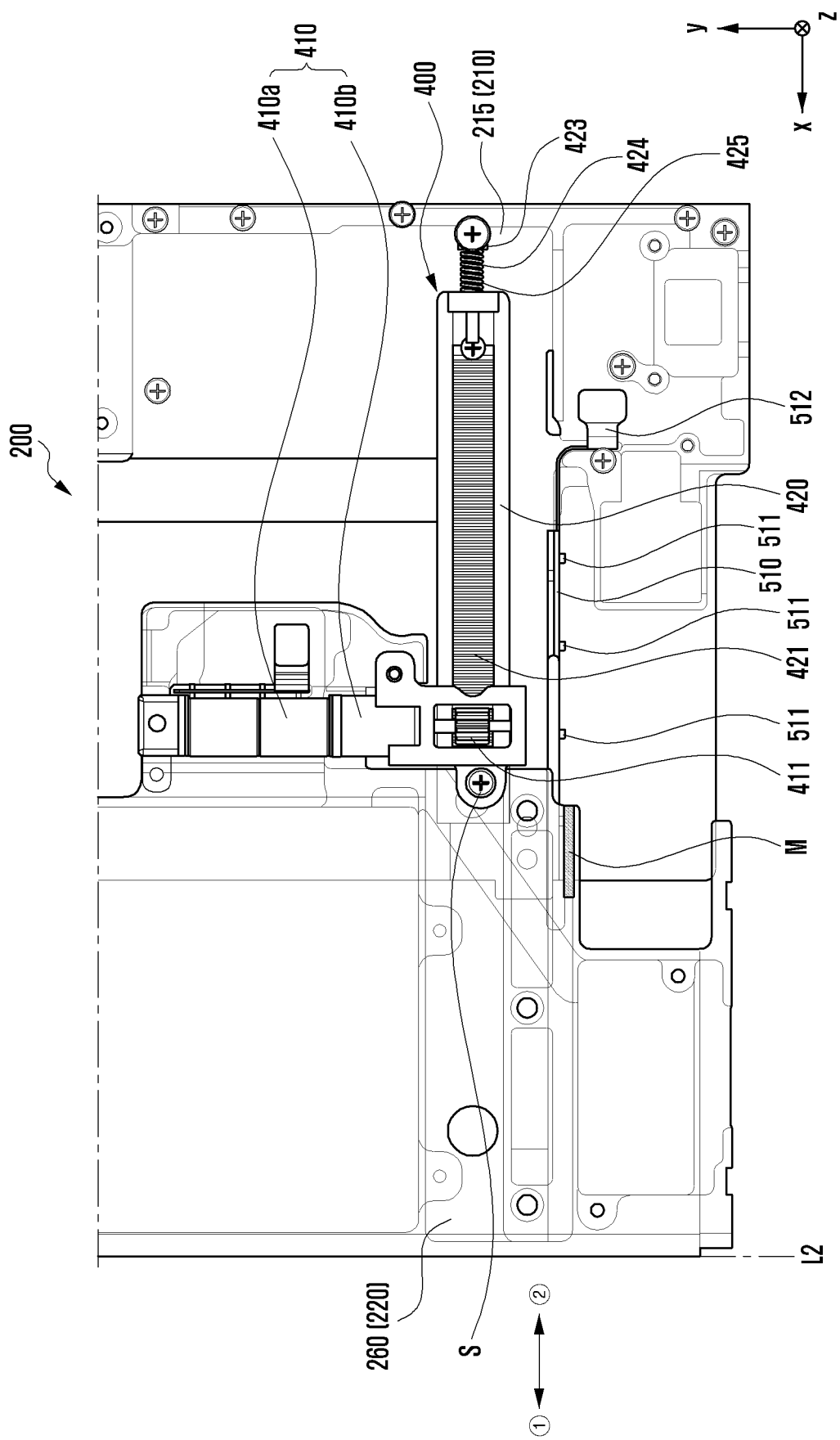
FIG. 11C is a view illustrating a configuration of a main part of the electronic device illustrated in FIG. 11A according to an embodiment of the disclosure.

FIGS. 11A and 11B are views obtained by viewing a cross section of an electronic device taken along line 11a-11a of FIG. 8B in state 3 according to various embodiments of the disclosure. FIG. 11C is a view illustrating a configuration of a main part of the electronic device illustrated in FIG. 11A according to an embodiment of the disclosure.

In describing the components of the electronic device 200 of FIGS. 11A to 11C, the same reference numerals are given to components that are substantially the same as those of the electronic device 200 of FIGS. 9A to 9D, and a detailed description thereof may be omitted.

Referring to FIGS. 11A to 11C, in state 2 (e.g., state 2 of FIG. 8B), when detecting that the second housing 220 is moved by the push-pull section D via the movement distance detection sensor 500, the electronic device 200 (e.g., the processor 120 of FIG. 1) may determine it as a triggering operation for slide-out and may operate the drive motor 410. For example, through a gearing operation with the rack gear 421 engaged with the pinion gear 411 of the drive motor 410, the second housing 220 may be moved to the slide-out direction (direction ①) along the rack gear 421. Accordingly, the second housing 220 may be automatically changed to state 3, which is the slide-out state.

Figure 12A:
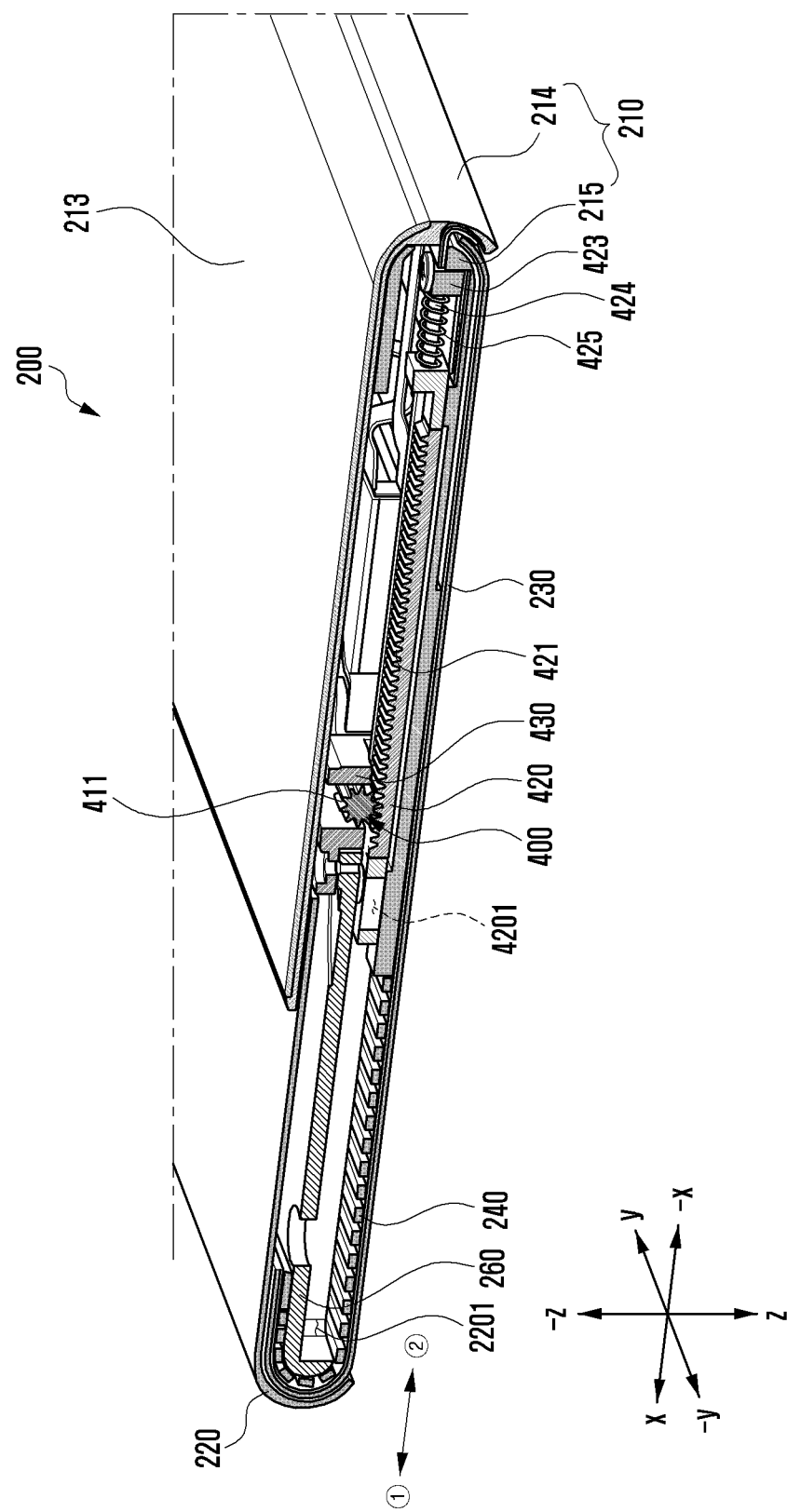
FIGS. 12A and 12B are views obtained by viewing a cross section of an electronic device taken along line 12a-12a of FIG. 8B in state 4 according to various embodiments of the disclosure.
Figure 12B:
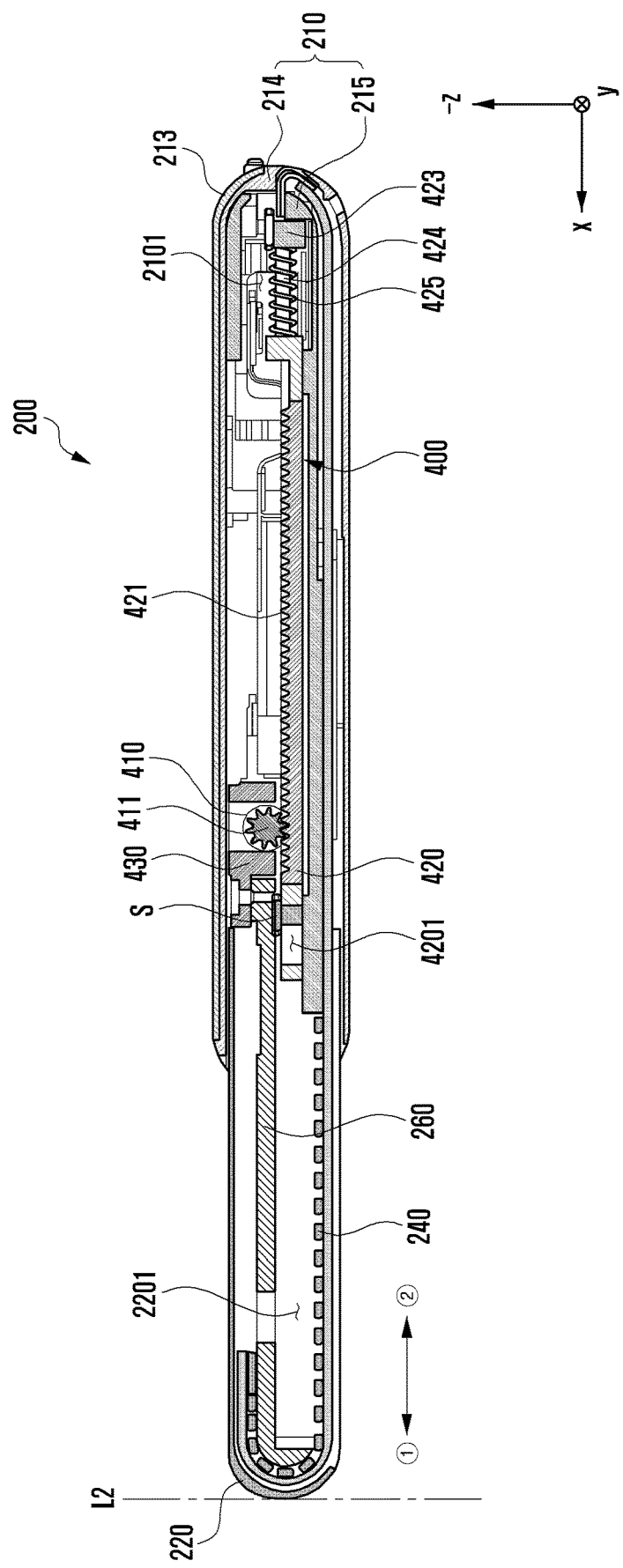
Figure 12C:
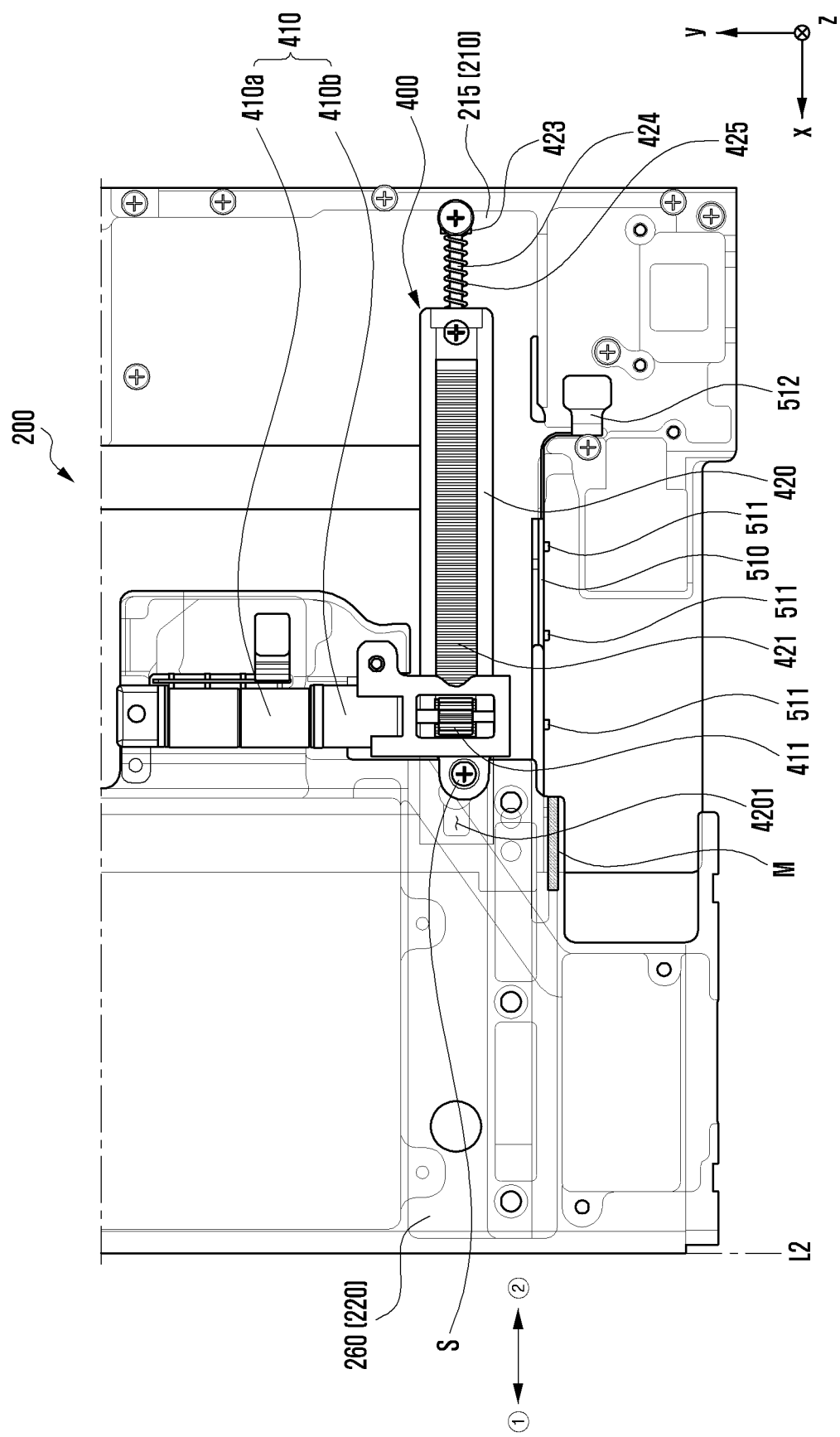
FIG. 12C is a view illustrating a configuration of a main part of the electronic device illustrated in FIG. 12A according to an embodiment of the disclosure.

FIGS. 12A and 12B are views obtained by viewing a cross section of an electronic device taken along line 12a-12a of FIG. 8B in state 4 according to various embodiments of the disclosure. FIG. 12C is a view illustrating a configuration of a main part of the electronic device illustrated in FIG. 12A according to an embodiment of the disclosure.

In describing the components of the electronic device 200 of FIGS. 12A to 12C, the same reference numerals are given to components that are substantially the same as those of the electronic device 200 of FIGS. 9A to 9D, and a detailed description thereof may be omitted.

Referring to FIGS. 12A to 12C, when detecting, via the movement distance detection sensor 500, that the state in which the second housing 200 is completely slid out in state 3 (e.g., state 3 of FIG. 8B), the electronic device 200 (e.g., the processor 120 of FIG. 1) may be changed from state 3 to state 4 by driving the drive motor 410 to rotate the pinion gear 411 in reverse direction by a predetermined amount of rotation. Therefore, while the second housing 220 maintains the slide-out state, the rack gear structure 420 is movable by a predetermined section to the slide-out direction (direction ①) through the rotation of the pinion gear 411M the inner space of the electronic device 200. According to an embodiment of the disclosure, the moved section of the rack gear structure 420 may be substantially equal to the push-pull section D. According to an embodiment of the disclosure, by the movement of the rack gear structure 420, the suspension 425 may be restored to the relaxed state while pressing the rack gear structure 420 to the slide-out direction (direction ①) as in state 1.

Figure 13A:
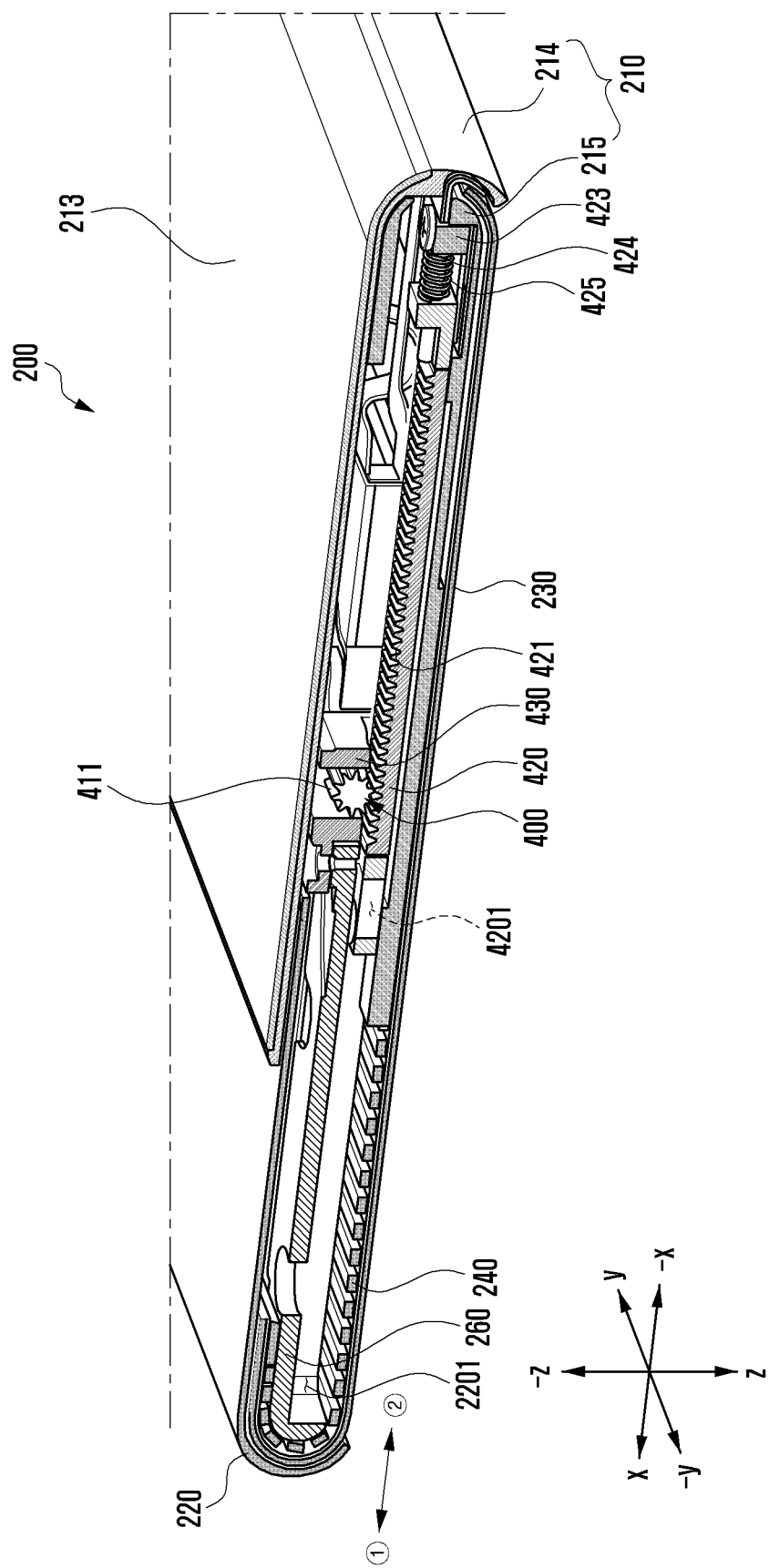
FIGS. 13A and 13B are views obtained by viewing a cross section of an electronic device taken along line 13a-13a of FIG. 8B in state 5 according to various embodiments of the disclosure.
Figure 13B:
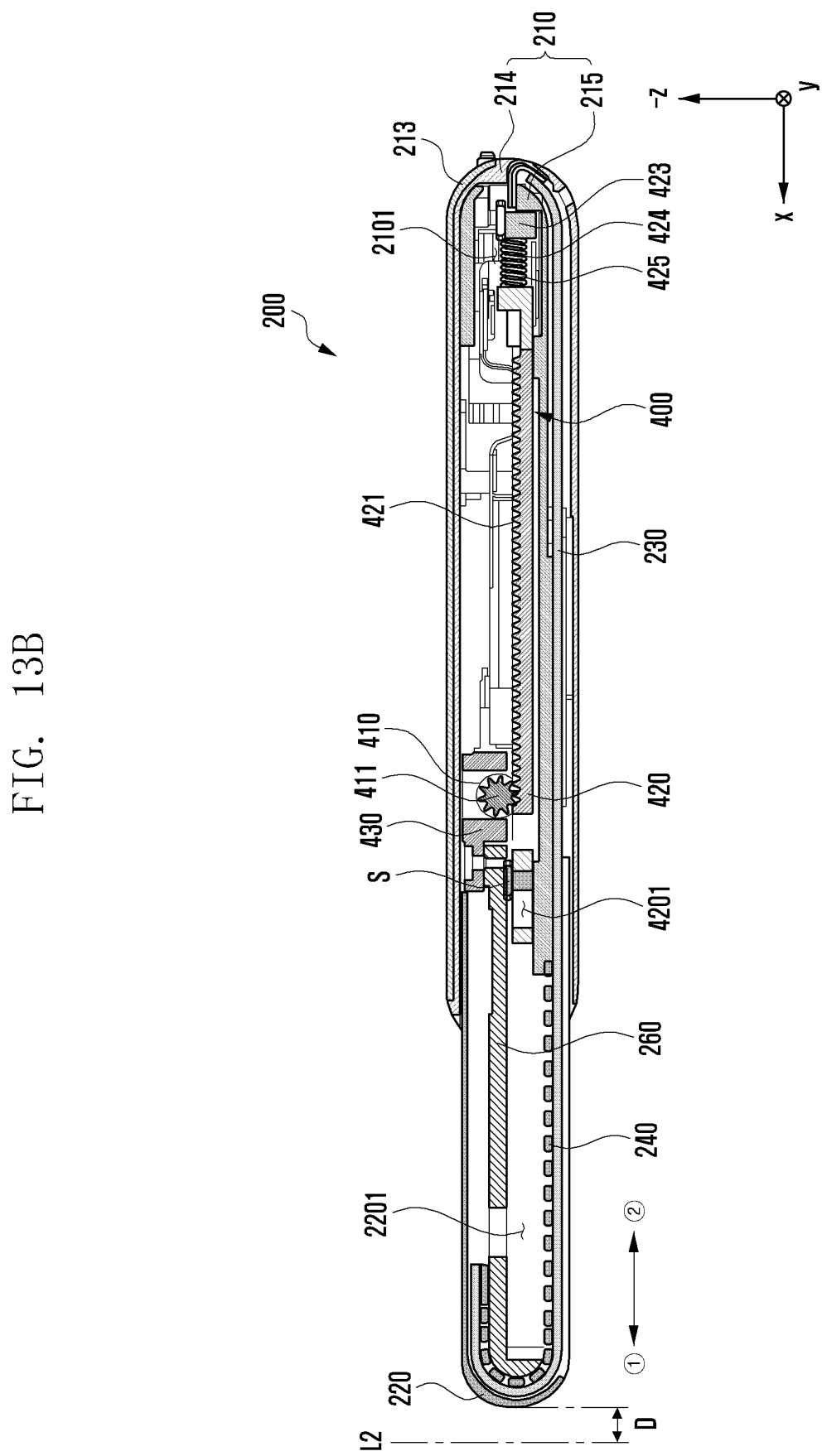
Figure 13C:
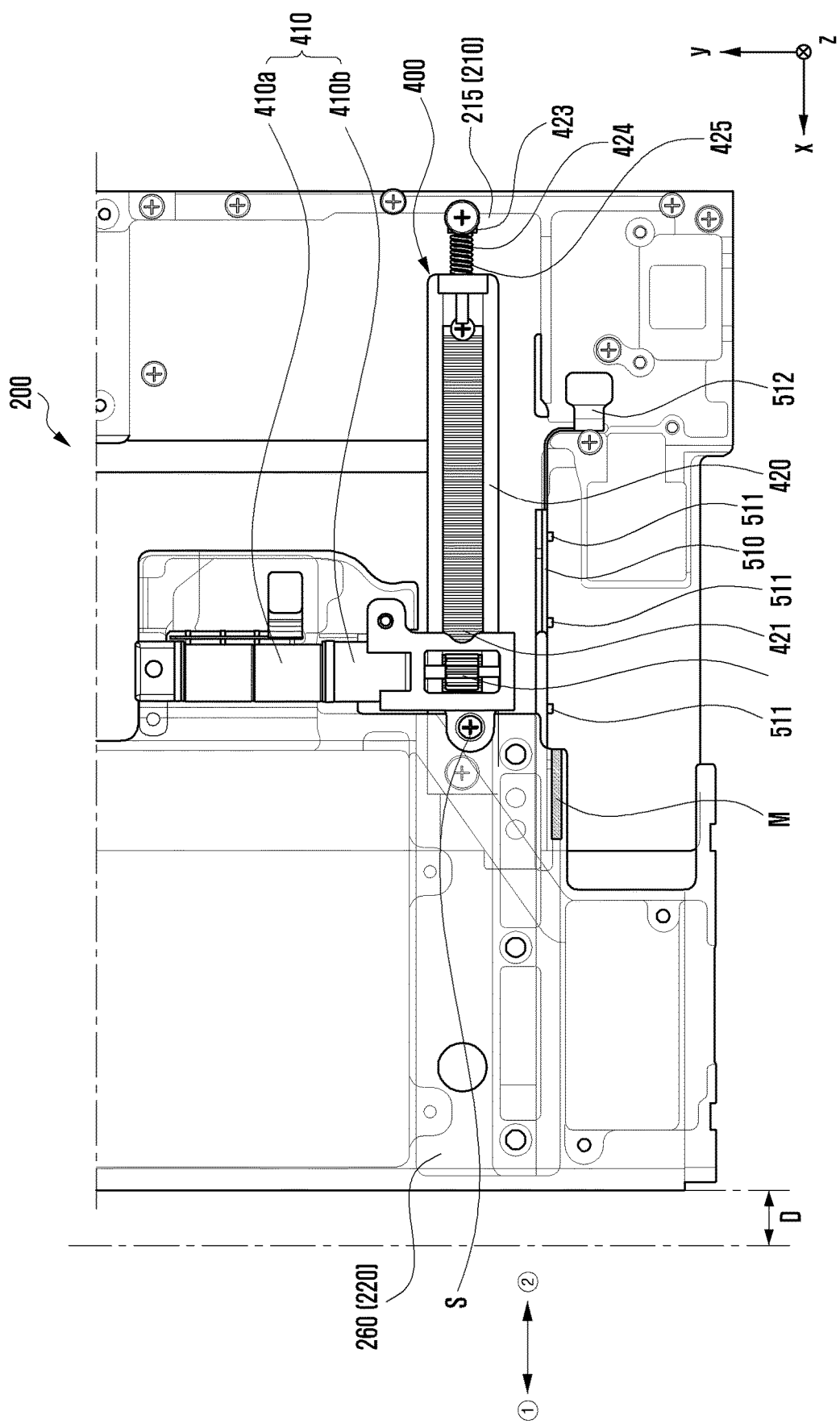
FIG. 13C is a view illustrating a configuration of a main part of the electronic device illustrated in FIG. 13A according to an embodiment of the disclosure.

FIGS. 13A and 13B are views obtained by viewing a cross section of an electronic device taken along line 13a-13a of FIG. 8B in state 5 according to various embodiments of the disclosure. FIG. 13C is a view illustrating a configuration of a main part of the electronic device illustrated in FIG. 13A according to an embodiment of the disclosure.

In describing the components of the electronic device 200 of FIGS. 13A to 13C, the same reference numerals are given to components that are substantially the same as those of the electronic device 200 of FIGS. 9A to 9D, and a detailed description thereof may be omitted.

Referring to FIGS. 13A to 13C, in state 5 (e.g., state 5 of FIG. 8A), the electronic device 200 (e.g., the processor 120 of FIG. 1) may detect a movement distance in which the second housing 220 is moved by the push-pull section D to the slide-in direction (e.g., direction ②) through the user's manipulation. For example, the push-pull section D may include a section in which the second housing 220 is further slid in by a predetermined distance to the slide-in direction (e.g., direction ②) beyond the second reference line L2 in the slide-out state of the electronic device 200. According to an embodiment of the disclosure, the electronic device 200 may detect the movement of the second housing 220 moved by the push-pull section D via the movement distance detection sensor 500. In this case, the drive motor 410 is not driven, and through the back drive force of the drive motor 410, the rack gear structure 420 including the rack gear 421 engaged with the pinion gear 411 may be moved with the second housing 200 to the slide-in direction (e.g.; direction ②). According to an embodiment of the disclosure, the suspension 425 may retain elasticity through the movement of the rack gear structure 420 to the slide-in direction (e.g., direction ②) and may maintain a pressed state in which the suspension is contracted by the distance moved by the rack gear structure 420.

According to various embodiments of the disclosure, when detecting that the second housing 220 is moved by the push-pull section D via the movement distance detection sensor 500, the electronic device 200 (e.g., the processor 120 of FIG. 1) may determine it as a triggering operation for slide-in and may operate the drive motor 410. For example, through a gearing operation with the rack gear 421 engaged with the pinion gear 411 of the drive motor 410, the second housing 220 may be moved to the slide-in direction (direction ②) along the rack gear 421 and, and the second housing may be automatically changed to the slide-out state (e.g., state 1). In this case, the suspension 425 may be changed to state 1 by being naturally restored to the original relaxed state through the gearing operation of the pinion gear 411 that is moved to the slide-in direction (e.g., direction ②) along the rack gear 421.

According to various embodiments of the disclosure, when detecting a malfunction state in which the second housing is moved to the slide-in direction (direction ②) with a movement amount smaller than the push-pull section D in the slide-in state or the draw-out state, the electronic device 200 (e.g., the processor 120 of FIG. 1) may restore the second housing 220 to its original position with the driving force of the drive motor 410. In some embodiments of the disclosure, when in the above-described malfunction state, the second housing 220 may be restored to its original position by the restoring force of the suspension 425. In some embodiments of the disclosure, when in the above-described malfunction state, the second housing 220 may be restored to its original position by using both the driving force of the drive motor 410 and the restoring force of the suspension 425.

Figure 14A:
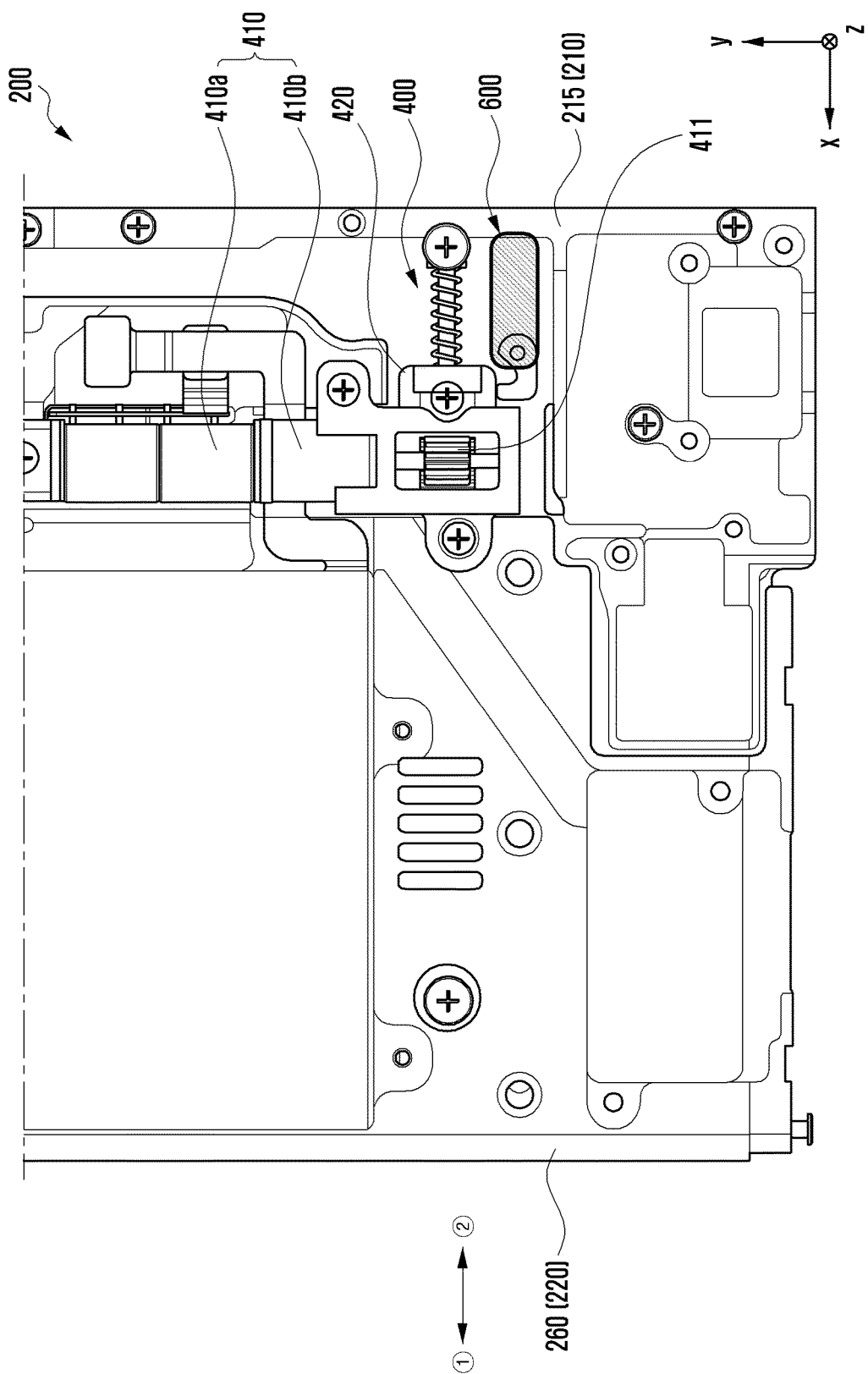
FIG. 14A is a view illustrating a portion of the configuration of an electronic device including a movement prevention structure according to an embodiment of the disclosure.
Figure 14B:
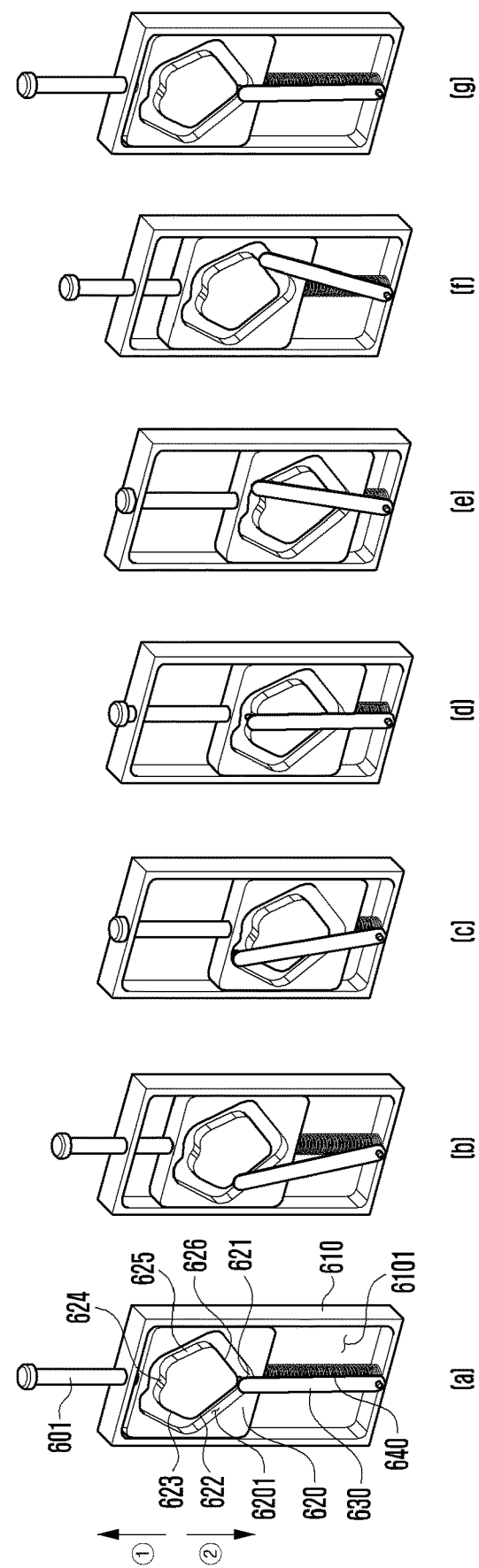
FIG. 14B is a view illustrating operating states of the movement prevention structure according to an embodiment of the disclosure.

FIG. 14A is a view illustrating a portion of the configuration of an electronic device including a movement prevention structure according to an embodiment of the disclosure. FIG. 14B is a view illustrating operating states of the movement prevention structure according to an embodiment of the disclosure.

Referring to FIGS. 14A and 14B, in the slide-in state, the electronic device 200 may detect, via the movement distance detection sensor 500, a state in which the second housing 220 is moved by the push-pull section D, and may drive the drive motor 410 to move the second housing 220 to the slide-out direction (direction). In this case, the rack gear structure 420 is moved in a state of pressing the suspension 425, but when the restoring force of the suspension 425 is configured to be relatively large, the rack gear structure 420 may be arbitrarily moved to the slide-out direction (direction C)) during the slide-in operation. Accordingly, the electronic device 200 may include a movement prevention structure 600 disposed in the bracket housing 215 and configured to prevent the above-described rack gear structure 420 from being arbitrarily moved during the slide-out operation.

According to various embodiments of the disclosure, the movement prevention structure 600 may include a link housing 610 fixed to the bracket housing 215 and including an inner space 6101, a moving structure 620 disposed to be movable along a slide-in/out direction in the inner space of the link housing 610 and including a link guide path 6201 having a closed loop shape, a link 630 including one end coupled to move along the link guide path 6201 and the other end rotatably coupled to the link housing 610, and a spring 640 configured to press the moving structure 620 to the slide out direction in the inner space 6101 of the link housing 610. According to an embodiment of the disclosure, the moving structure 620 may include a structure connecting portion 601 extending through a portion of the link housing 610 and connected a vicinity of the suspension 425 of the rack gear structure 420. Therefore, when the rack gear structure 420 is slide to the slide-in direction (direction ②), the structure connecting portion 601 is pressed so that the moving structure 620 disposed in the inner space 6101 of the link housing 610 may be moved in the link housing 610 in conjunction with the rack gear structure.

According to various embodiments of the disclosure, the link guide path 6201 may have a closed loop shape provided in a recessed manner in the outer surface of the moving structure 620 and may include a first engagement portion 621 in which the engaged state of the link 630 is maintained while the suspension 425 is not pressed, a first inclined portion 622 which extends from the first engagement portion 621, a second inclined portion 623 which extends from the first inclined portion 622, a second engagement portion 624 which is connected to the second inclined portion 623 and in which the engaged state of the link 630 is maintained while the suspension 425 is pressed, a third inclined portion 625 which extends from the second engagement portion 624, and a fourth inclined portion 626 which extends from the third inclined portion 625 and is connected to the first engagement portion 621 again. According to an embodiment of the disclosure, the first engagement portion 621 and the second engagement portion 624 may be disposed at opposite positions. According to an embodiment of the disclosure, the link guide path 6201 may be configured in a diamond shape through the first, second, third, and fourth inclined portions 622, 623, 625, and 626.

According to various embodiments of the disclosure, when the electronic device 200 is in the slide-out state, the link 630 may be maintained in the state of being engaged with the first engagement portion 621 (state (a)). According to an embodiment of the disclosure, in the slide-out state, when the second housing 220 is moved by the push-pull section D to the slide-in direction (direction ②), through the movement of the rack gear structure 420, the moving structure 620 may also be moved to the slide-in direction (direction ②) while being pressed by the spring 640. In this case, during the push-pull section D, by the movement of the moving structure 620, the link 630 may be separated from the first engagement portion 621 of the link guide path 6201 and may be moved along the first inclined portion 622 and the second inclined portion 623 (operations (b) and (c)). According to an embodiment of the disclosure, when the movement of the rack gear structure 420 by the push-pull section D is completed, one end of the link 630 may be changed to a state of being engaged with the second engagement portion 624 (state (d)). Accordingly, by the locking structure in which the link 630 is engaged with the second engagement portion 624, the structure connecting portion 601 may be maintained in the state of being moved to the direction (direction ②), and the phenomenon in which the rack gear structure 420 is also arbitrarily moved by the repulsive force of the flexible display 230 may be prevented.

As another example, when the electronic device 200 is in the slide-in state, the link 630 may be maintained in the state of being engaged with the second engagement portion 624 (state (d)). According to an embodiment of the disclosure, in the slide-in state, when the second housing 220 is moved by the push-pull section D to the slide-in direction (direction ②), through the movement of the rack gear structure 420, the moving structure 620 may also be moved to the slide-in direction (direction ②) while being pressed by the spring 640. In this case, during the push-pull section D, by the movement of the moving structure 620, the link 630 may be separated from the second engagement portion 624 of the link guide path 6201 and may be moved along the third inclined portion 625 and the fourth inclined portion 626 (operations (e) and (f)). According to an embodiment of the disclosure, when the movement of the rack gear structure 420 by the push-pull section D is completed, one end of the link 630 may be changed to a state of being engaged with the first engagement portion 621 again (state (g)).

Figure 15:
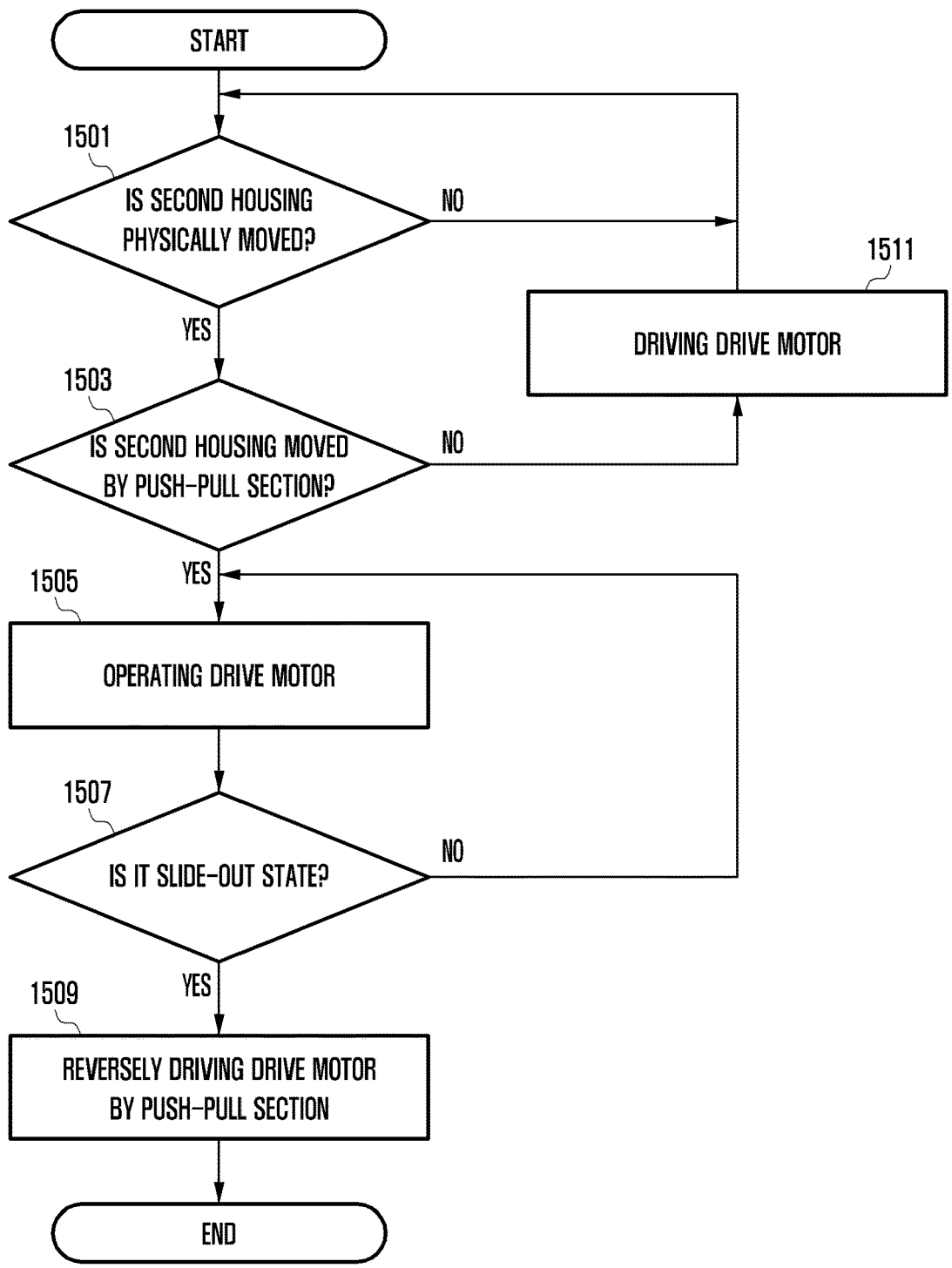
FIG. 15 is a flowchart illustrating the operating states of an electronic device through a push-pull triggering operation according to an embodiment of the disclosure.

FIG. 15 is a flowchart illustrating the operating states of an electronic device through a push-pull triggering operation according to an embodiment of the disclosure.

FIG. 15 is a flowchart illustrating operating states while an electronic device 200 is changed from a slide-in state to a slide-out state.

Referring to FIGS. 9A to 9D, 10A to 10C, 11A to 11C, 12A to 12C, 13A, 13B, and 15, in operation 1501, the electronic device 200 (e.g., the processor 120 of FIG. 1) may detect whether the second housing 220 is physically moved. For example, as a triggering operation for changing from the slide-in state to the slide-out state, the electronic device 200 may detect whether the second housing 220 is moved by the push-pull section D to the slide-in direction (direction ②). According to an embodiment of the disclosure, the electronic device 200 may detect the movement of the second housing 220 by detecting the magnetic force of the at least one magnet M disposed on the sliding frame 260 via the movement distance detection sensor 500 disposed on in the bracket housing 215.

In operation 1503, the electronic device 200 (e.g., the processor 120 of FIG. 1) may detect whether the second housing 220 is moved by the push-pull section D. According to an embodiment of the disclosure, the electronic device 200 may detect whether the second housing 220 is moved by the push-pull section D via the movement distance detection sensor 500. According to an embodiment of the disclosure, when the second housing 220 is moved by the push-pull section D, the rack gear structure 420 may be changed to the state of being moved to the slide-in direction (direction ②) while being pressed by the suspension 425. In some embodiments of the disclosure, the position of the rack gear structure 420 moved to the slide-in direction (direction ②), the position of the rack gear structure 420 may be maintained by the above-described movement prevention structure (e.g., the movement prevention structure 600 of FIG. 14A).

In operation 1505, when the second housing 220 is moved by the push-pull section D, the electronic device 200 may drive the drive motor 410. According to an embodiment of the disclosure, in the slide-in state, when the pinion gear 411 of the drive motor 410 rotates along the rack gear 421, the sliding frame to which the drive motor 410 and the drive motor 410 are coupled may be automatically moved to the slide-out direction (direction ①) with the second housing 220. For example, the electronic device 200 may stop the driving of the drive motor 410 when it is detected that the second housing 220 is moved to a predetermined slide-out distance via the movement distance detection sensor 500. In some embodiments of the disclosure, the electronic device 200 may detect that the second housing 220 is moved by the predetermined slide-out distance via another movement distance detection sensor disposed separately from the movement distance detection sensor 500.

When detecting that the second housing 220 is changed from the slide-in state to the slide-out state in operation 1507, the electronic device 200 (e.g., the processor 120 of FIG. 1) may reversely rotating the drive motor 410 in operation 1509 to move the rack gear structure 420 by the push-pull section D to the slide-out direction (direction ①), thereby preparing for a triggering operation for changing from the slide-out state to the slide-in state. In this case, the second housing 220 may not be moved.

According to various embodiments of the disclosure, in operation 1503, when the second housing 220 is not moved by the push-pull section D, the electronic device 200 (e.g., the processor of FIG. 1) may determine it as a malfunction, and operation 1511, the electronic device 200 may control the driving of the drive motor 410 to restore the second housing 220 to its original slide-in state.

Figure 16:
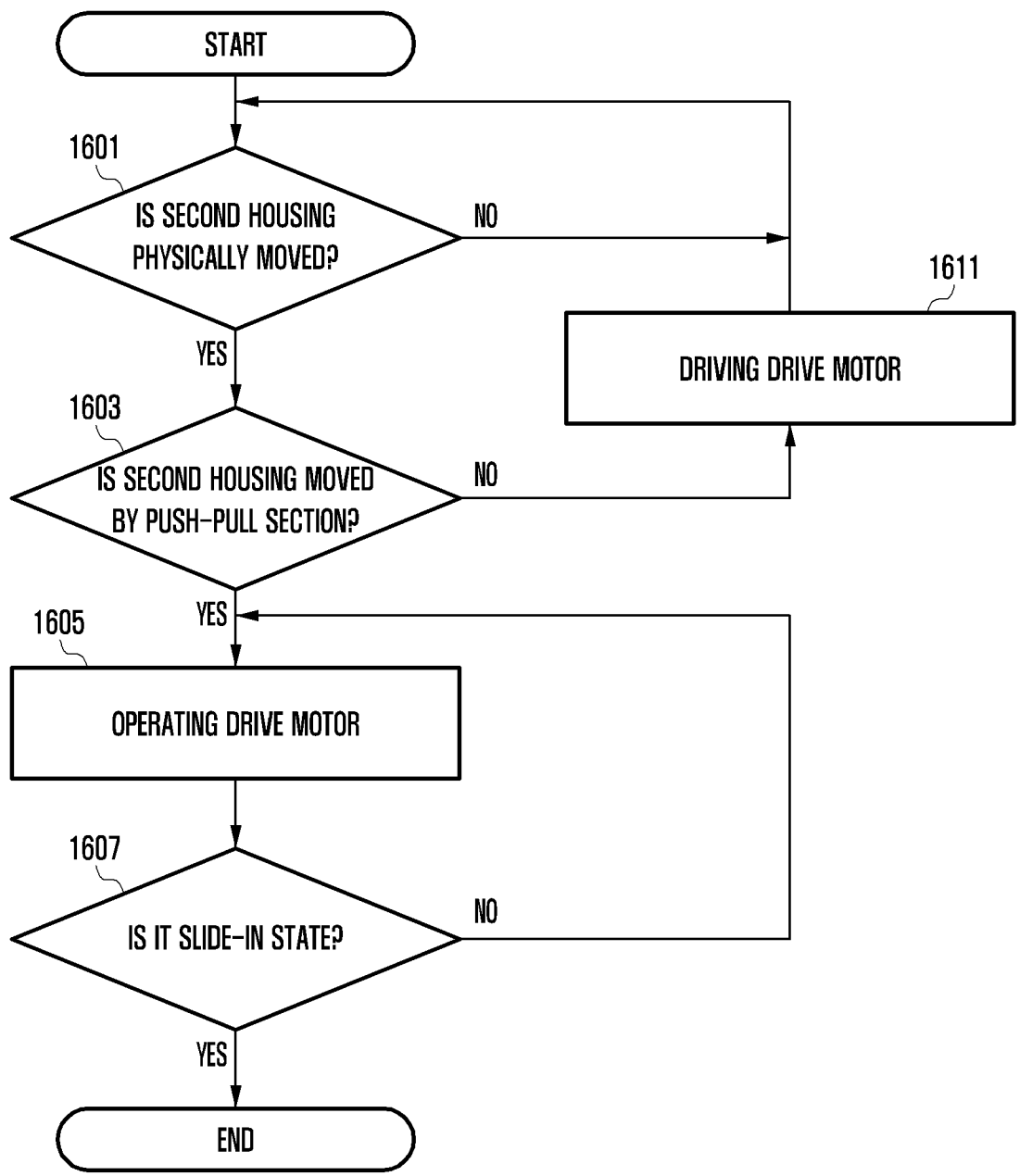
FIG. 16 is a flowchart illustrating the operating states of an electronic device through a push-pull triggering operation according to an embodiment of the disclosure.

FIG. 16 is a flowchart illustrating the operating states of an electronic device through a push-pull triggering operation according to an embodiment of the disclosure.

FIG. 16 is a flowchart illustrating operating states while an electronic device 200 is changed from a slide-out state to a slide-in state.

Referring to FIGS. 9A to 9D, 10A to 10C, 11A to 11C, 12A to 12C, 13A, 13B, and 16, in operation 1601, the electronic device 200 (e.g., the processor 120 of FIG. 1) may detect whether the second housing 220 is physically moved. For example, as a triggering operation for changing from the slide-out state to the slide-in state, the electronic device 200 may detect whether the second housing 220 is moved by the push-pull section D to the slide-in direction (direction ②) According to an embodiment of the disclosure, the electronic device 200 may detect the movement of the second housing 220 by detecting the magnetic force of the at least one magnet M disposed on the sliding frame 260 via the movement distance detection sensor 500 disposed on in the bracket housing 215.

In operation 1603, the electronic device 200 (e.g., the processor 120 of FIG. 1) may detect whether the second housing 220 is moved by the push-pull section D. According to an embodiment of the disclosure, the electronic device 200 may detect whether the second housing 220 is moved by the push-pull section D via the movement distance detection sensor 500. According to an embodiment of the disclosure, when the second housing 220 is moved by the push-pull section D, the rack gear structure 420 may be changed to the state of being moved to the slide-in direction (direction ②) while being pressed by the suspension 425. In some embodiments of the disclosure, the position of the rack gear structure 420 moved to the slide-in direction (direction ②), the position of the rack gear structure 420 may be maintained by the above-described movement prevention structure (e.g., the movement prevention structure 600 of FIG. 14A).

In operation 1605, when the second housing 220 is moved by the push-pull section D, the electronic device 200 may drive the drive motor 410. According to an embodiment of the disclosure, in the slide-out state, when the pinion gear 411 of the drive motor 410 rotates along the rack gear 421, the sliding frame to which the drive motor 410 and the drive motor 410 are coupled may be automatically moved to the slide-in direction (direction ②) with the second housing 220.

In operation 1607, the electronic device 200 may stop the driving of the drive motor 410 when it is detected that the second housing 220 is moved to a predetermined slide-in distance via the movement distance detection sensor 500. In some embodiments of the disclosure, the electronic device 200 may detect that the second housing 220 is moved by the predetermined slide-in distance via another movement distance detection sensor disposed separately from the movement distance detection sensor 500. According to an embodiment of the disclosure, when the slide-out state is changed to the slide-in state, the rack gear structure 420 may be naturally moved by the push-pull section D to the slide-out direction (direction ①) by the rotating direction of the pinion gear 411 and the slide-in direction (direction ②) of the second housing 220. Thus, additional driving (e.g., reverse driving) of the drive motor 410 may not be required in the slide-in state.

According to various embodiments of the disclosure, in operation 1603, when the second housing 220 is not moved by the push-pull section D, the electronic device 200 (e.g., the processor 120 of FIG. 1) may determine it as a malfunction, and operation 1611, the electronic device 200 may control the driving of the drive motor 410 to restore the second housing 220 to its original slide-out state.

According to various embodiments of the disclosure, an electronic device (e.g., the electronic device 200 in FIG. 9A) may include a first housing (e.g., the first housing 210 in FIG. 9A), a second housing (e.g., the second housing 220 in FIG. 9A) slidably coupled to the first housing, a flexible display (e.g., the flexible display 230 in FIG. 9A) configured to be expanded or contracted based on slide-out or slide-in movement of the first housing, a drive motor (e.g., the drive motor 410 in FIG. 5A) disposed in the second housing and including a pinion gear (e.g., the pinion gear 411 in FIG. 9A), a rack gear structure (e.g., the rack gear structure 420 in FIG. 9A) disposed in the first housing and including a rack gear (e.g., the rack gear 421 in FIG. 9A) engaged with the pinion gear, at least one sensor module (e.g., the movement distance detection sensor 500 in FIG. 7) configured to detect movement of the second housing, a memory (e.g., the memory 130 in FIG. 1) configured to store executable instructions, and at least one processor (e.g., the processor 120 in FIG. 1) configured to access the memory and execute the instructions. The at least one processor may be configured to control the drive motor based on sensing information detected from the at least one sensor module.

According to various embodiments of the disclosure, when the second housing is moved by the push-pull section, the drive motor may not be driven.

According to various embodiments of the disclosure, when the second housing is moved by the push-pull section, the rack gear structure may be moved with the second housing through the engagement of the pinion gear and the rack gear.

According to various embodiments of the disclosure, the rack gear structure may include a guide groove having a length, and the movement distance may be determined by a guide screw penetrating the guide groove and then fixed to the first housing.

According to various embodiments of the disclosure, the movement distance of the rack gear structure may be substantially equal to the push-pull section.

According to various embodiments of the disclosure, a suspension disposed in the first housing and configured to press the rack gear structure to a slide-out direction may be further included.

According to various embodiments of the disclosure, the suspension may include a support disposed in the first housing, a guide shaft connected to the support and configured to guide the rack gear structure in the sliding direction, and a spring disposed between the support and the rack gear structure in such a way that the guide shaft penetrates the spring and configured to urge the rack gear structure to the slide-out direction.

According to various embodiments of the disclosure, the at least one sensor module may include a substrate disposed in the first housing to have a length along the sliding direction and one or more sensor modules disposed on the substrate to be spaced apart from each other by a predetermined interval, and the at least one sensor module may be configured to detect a magnetic force of at least one magnet disposed at a corresponding position in the second housing.

According to various embodiments of the disclosure, the at least one processor may be configured to drive, via the at least one sensor module, the drive motor when detecting that the second housing is moved by a predetermined movement distance to a slide-in direction.

According to various embodiments of the disclosure, the at least one processor may be configured to control the drive motor such that the second housing is changed to a slide-out state when detecting that the second housing is moved by the push-pull section in the slide-in state.

According to various embodiments of the disclosure, the at least one processor may be configured to control the drive motor such that the rack gear structure is moved to its original position after the slide-in state is changed to the slide-out state.

According to various embodiments of the disclosure, the at least one processor may be configured to control the drive motor such that the second housing is changed to a slide-out state when detecting that the second housing is moved by the push-pull section in the slide-out state.

According to various embodiments of the disclosure, the at least one processor may be configured to control the drive motor to restore the second housing to its original position when detecting that the second housing is moved by a distance smaller than the push-pull section.

According to various embodiments of the disclosure, the second housing may further include a sliding frame slidably coupled to the first housing, and the drive motor may be coupled to the sliding frame.

According to various embodiments of the disclosure, a support member connected to the first housing, disposed to be supported by the sliding frame, and at least partially accommodated in an inner space of the second housing in a slide-in state may be further included, and at least a portion of the flexible display may be disposed to be supported by the support member.

According to various embodiments of the disclosure, an electronic device (e.g., the electronic device 200 in FIG. 9A) may include a first housing (e.g., the first housing 210 in FIG. 9A), a second housing (e.g., the second housing 220 in FIG. 9A) including a sliding frame (e.g., the sliding frame 260 of FIG. 9A) slidably coupled to the first housing, a flexible display (e.g., the flexible display 230 in FIG. 9A) disposed to be supported by the first housing and the second housing and having an exposed area expended when a slide-in state in which at least a portion of the second housing accommodated in the first housing is changed to a slide-out state, a drive motor (e.g., the drive motor 410 in FIG. 5A) disposed in the second housing and including a pinion gear (e.g., the pinion gear 411 in FIG. 9A), a rack gear structure (e.g., the rack gear structure 420 of FIG. 9A) disposed in the first housing to be at least partially movable in a sliding direction and including a rack gear (e.g., the rack gear 421 of FIG. 9A) engaged with the pinion gear, at least one sensor module (e.g., the movement distance detection sensor 500 of FIG. 7) disposed in the first housing or the second housing and configured to detect the movement of the sliding frame, and at least one processor (e.g., the processor 120 of FIG. 1) configured to control the drive motor based on sensing information provided from the at least one sensor module. The at least one processor may drive the drive motor when detecting, via the at least one sensor module, that the second housing is moved by a predetermined movement distance (e.g., the push-pull section D in FIGS. 8A and 8B) to the slide-in direction (e.g., the slide-in direction (direction ②)) of FIG. 9A).

According to various embodiments of the disclosure, when the second housing is moved by the push-pull section, the drive motor may not be driven.

According to various embodiments of the disclosure, when the second housing is moved by the predetermined movement distance, the rack gear structure may be moved with the second housing through the engagement of the pinion gear and the rack gear.

According to various embodiments of the disclosure, the movement distance of the rack gear structure may be substantially equal to the push-pull section.

According to various embodiments of the disclosure, a suspension disposed in the first housing and configured to press the rack gear structure to a slide-out direction may be further included.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a first housing;
a second housing slidably coupled to the first housing;
a flexible display configured to be expanded or contracted based on movement of the second housing with respect to the first housing;
a drive motor comprising a pinion gear;
a rack gear structure comprising a rack gear engaged with the pinion gear and configured to move the second housing;
at least one sensor module configured to detect movement of the second housing;
a memory configured to store executable instructions; and
at least one processor configured to:
access the memory and execute the instructions,
control the drive motor to change a state of the electronic device between a slide-in state and a slide-out state based on sensing information detected from the at least one sensor module,
when the second housing is moved by a predetermined movement distance in a slide-in direction while in the slide-in state of the electronic device, control the drive motor to change the state of the electronic device from the slide-in state to the slide-out state, and
when the second housing is moved by a predetermined movement distance in the slide-in direction while in the slide-out state of the electronic device, control the drive motor to change the state of the electronic device from the slide-out state to the slide-in state.

2. The electronic device of claim 1, wherein the drive motor is not driven when the second housing is moved by a predetermined movement distance in the slide-in direction, the rack gear structure is moved with the second housing through the engagement of the pinion gear and the rack gear.

3. The electronic device of claim 2, wherein, when the second housing is moved by the predetermined movement distance, the rack gear structure is moved with the second housing through the engagement of the pinion gear and the rack gear.

4. The electronic device of claim 2,
wherein the rack gear structure comprises a guide groove having a length, and
wherein a movement distance of the rack gear structure is determined by a guide screw penetrating the guide groove and then fixed to the first housing.

5. The electronic device of claim 4, wherein the movement distance of the rack gear structure is substantially equal to the predetermined movement distance of the second housing.

6. The electronic device of claim 1 further comprising:
a suspension disposed in the first housing and configured to press the rack gear structure in a slide-out direction.

7. The electronic device of claim 6, wherein the suspension comprises:
a support disposed in the first housing;
a guide shaft connected to the support and configured to guide the rack gear structure in the slide-in or slide-out direction of the second housing; and
a spring disposed between the support and the rack gear structure in such a way that the guide shaft penetrates the spring and configured to urge the rack gear structure in the slide-out direction.

8. The electronic device of claim 1,
wherein the at least one sensor module comprises:
a substrate disposed in the first housing to have a length along the slide-in or slide-out direction of the second housing, and
one or more sensor modules disposed on the substrate to be spaced apart from each other by a predetermined interval, and
wherein the at least one sensor module is configured to detect a magnetic force of at least one magnet disposed at a corresponding position in the second housing.

9. The electronic device of claim 1, wherein the at least one processor is further configured to drive the drive motor in response to the at least one sensor module detecting that the second housing is moved by the predetermined movement distance to in the slide-in direction in the slide-in state or the slide-out state.

10. The electronic device of claim 1, wherein the at least one processor is further configured to control the drive motor such that the rack gear structure is moved to its original position after the slide-in state is changed to the slide-out state.

11. The electronic device of claim 1, wherein the at least one processor is further configured to control the drive motor to restore the second housing to its original position when the second housing is moved by a distance smaller than the predetermined movement distance.

12. The electronic device of claim 1,
wherein the second housing further comprises a sliding frame slidably coupled to the first housing, and
wherein the drive motor is coupled to the sliding frame.

13. The electronic device of claim 12, further comprising:
a support member connected to the first housing, disposed to be supported by the sliding frame, and at least partially accommodated in an inner space of the second housing in a slide-in state,
wherein at least a portion of the flexible display is disposed to be supported by the support member.

14. An electronic device comprising:
a first housing;
a second housing including a sliding frame slidably coupled to the first housing;
a flexible display configured to be expanded or contracted based on movement of the second housing with respect to the first housing;
a drive motor disposed in the sliding frame and including a pinion gear,
a gear structure including a rack gear engaged with the pinion gear and configured to move the second housing;
at least one sensor module disposed in the first housing and configured to detect the movement of the sliding frame; and
at least one processor configured to:
control the drive motor to change a state of the electronic device between a slide-in state and a slide-out state based on sensing information provided from the at least one sensor module,
when the second housing is moved by a predetermined movement distance in a slide-in direction in the slide-in state of the electronic device, control the drive motor to change the state of the electronic device from the slide-in state to the slide-out state,
when the second housing is moved by the predetermined movement distance in the slide-in direction in the slide-out state of the electronic device, control the drive motor to change the state of the electronic device from the slide-out state to the slide-in state.

15. The electronic device of claim 14,
wherein the drive motor is configured to not be driven when the second housing is moved by a push-pull section.

16. The electronic device of claim 15,
wherein the gear structure is configured to be moved with the second housing through the engagement of the pinion gear and the rack gear when the second housing is moved by the predetermined movement distance.

17. The electronic device of claim 16,
wherein a movement distance of the gear structure is substantially equal to the push-pull section.

18. The electronic device of claim 14, further comprising a suspension disposed in the first housing and configured to press the rack gear structure in a slide-out direction.

* * * * *